United States Patent
Shouji et al.

(10) Patent No.: US 8,630,325 B2
(45) Date of Patent: Jan. 14, 2014

(54) MANUFACTURING METHOD, SURFACE-EMITTING LASER DEVICE, SURFACE-EMITTING LASER ARRAY, OPTICAL SCANNER, AND IMAGE FORMING APPARATUS

(71) Applicants: Hiroyoshi Shouji, Miyagi (JP); Shunichi Sato, Miyagi (JP); Toshihiro Ishii, Miyagi (JP); Kengo Makita, Kanagawa (JP); Masahiro Hayashi, Miyagi (JP); Toshihide Sasaki, Miyagi (JP); Akihiro Itoh, Miyagi (JP)

(72) Inventors: Hiroyoshi Shouji, Miyagi (JP); Shunichi Sato, Miyagi (JP); Toshihiro Ishii, Miyagi (JP); Kengo Makita, Kanagawa (JP); Masahiro Hayashi, Miyagi (JP); Toshihide Sasaki, Miyagi (JP); Akihiro Itoh, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/766,189

(22) Filed: Feb. 13, 2013

(65) Prior Publication Data
US 2013/0157397 A1    Jun. 20, 2013

Related U.S. Application Data

(62) Division of application No. 13/127,531, filed as application No. PCT/JP2009/069596 on Nov. 12, 2009, now Pat. No. 8,416,822.

(30) Foreign Application Priority Data

Nov. 20, 2008 (JP) .................................. 2008-296195
Apr. 15, 2009 (JP) .................................. 2009-098657
Oct. 2, 2009 (JP) .................................. 2009-230090

(51) Int. Cl.
H01S 5/00    (2006.01)

(52) U.S. Cl.
USPC ................. 372/44.01; 372/43.01; 372/46.01; 372/50.12; 372/50.124

(58) Field of Classification Search
USPC ...................... 372/43.01, 44.01, 46.01, 50.12
See application file for complete search history.

(56) References Cited

U.S. PATENT DOCUMENTS

| 5,177,031 A | 1/1993 | Buchmann et al. |
| 5,719,893 A | 2/1998 | Jiang et al. |

(Continued)

FOREIGN PATENT DOCUMENTS

| EP | 0760545 A1 | 3/1997 |
| JP | 3-126284 | 5/1991 |

(Continued)

OTHER PUBLICATIONS

European search report dated Oct. 26, 2012 in connection with corresponding European patent application No. 09827586.0.

(Continued)

*Primary Examiner* — Dung Nguyen
(74) *Attorney, Agent, or Firm* — Cooper & Dunham LLP

(57) ABSTRACT

A manufacturing method for manufacturing a surface-emitting laser device includes the steps of forming a laminated body in which a lower reflecting mirror, a resonator structure including an active layer, and an upper reflecting layer having a selective oxidized layer are laminated on a substrate; etching the laminated body to form a mesa structure having the selective oxidized layer exposed at side surfaces thereof; selectively oxidizing the selective oxidized layer from the side surfaces of the mesa structure to form a constriction structure in which a current passing region is surrounded by an oxide; forming a separating groove at a position away from the mesa structure; passivating an outermost front surface of at least a part of the laminated body exposed when the separating groove is formed; and coating a passivated part with a dielectric body.

8 Claims, 37 Drawing Sheets

(56) References Cited

U.S. PATENT DOCUMENTS

| | | |
|---|---|---|
| 5,923,691 A | 7/1999 | Sato |
| 5,939,733 A | 8/1999 | Sato |
| 6,002,700 A | 12/1999 | Sato |
| 6,072,196 A | 6/2000 | Sato |
| 6,207,973 B1 | 3/2001 | Sato et al. |
| 6,233,264 B1 | 5/2001 | Sato |
| 6,542,528 B1 | 4/2003 | Sato et al. |
| 6,563,851 B1 | 5/2003 | Jikutani et al. |
| 6,614,821 B1 | 9/2003 | Jikutani et al. |
| 6,674,777 B1 | 1/2004 | Nohava et al. |
| 6,674,785 B2 | 1/2004 | Sato et al. |
| 6,927,412 B2 | 8/2005 | Takahashi et al. |
| 6,959,025 B2 | 10/2005 | Takahashi et al. |
| 6,975,663 B2 | 12/2005 | Sekiya et al. |
| 7,684,458 B2 | 3/2010 | Sato et al. |
| 7,693,204 B2 | 4/2010 | Sato et al. |
| 7,720,125 B2 | 5/2010 | Jikutani et al. |
| 7,746,912 B2 | 6/2010 | Motomura et al. |
| 2003/0202552 A1 | 10/2003 | Ueki et al. |
| 2006/0109883 A1* | 5/2006 | Lewis et al. ............... 372/50.12 |
| 2006/0281292 A1 | 12/2006 | Trezza et al. |
| 2008/0055672 A1 | 3/2008 | Watanabe et al. |
| 2008/0056321 A1 | 3/2008 | Motomura et al. |
| 2008/0233017 A1 | 9/2008 | Sato et al. |
| 2009/0262770 A1 | 10/2009 | Itoh et al. |
| 2009/0295902 A1 | 12/2009 | Sato et al. |
| 2010/0060712 A1 | 3/2010 | Sato et al. |
| 2011/0127603 A1* | 6/2011 | Burke et al. ............... 257/331 |

FOREIGN PATENT DOCUMENTS

| | | |
|---|---|---|
| JP | 7-330487 | 12/1995 |
| JP | 2004-535057 | 11/2004 |
| JP | 2004-356271 | 12/2004 |
| JP | 2006-66681 | 3/2006 |
| JP | 2006-302919 | 11/2006 |
| JP | 2007-173513 | 7/2007 |
| JP | 2007-299896 | 11/2007 |
| JP | 2007-299897 | 11/2007 |

OTHER PUBLICATIONS

International Search Report and Written Opinion in PCT/JP2009/069596.

* cited by examiner

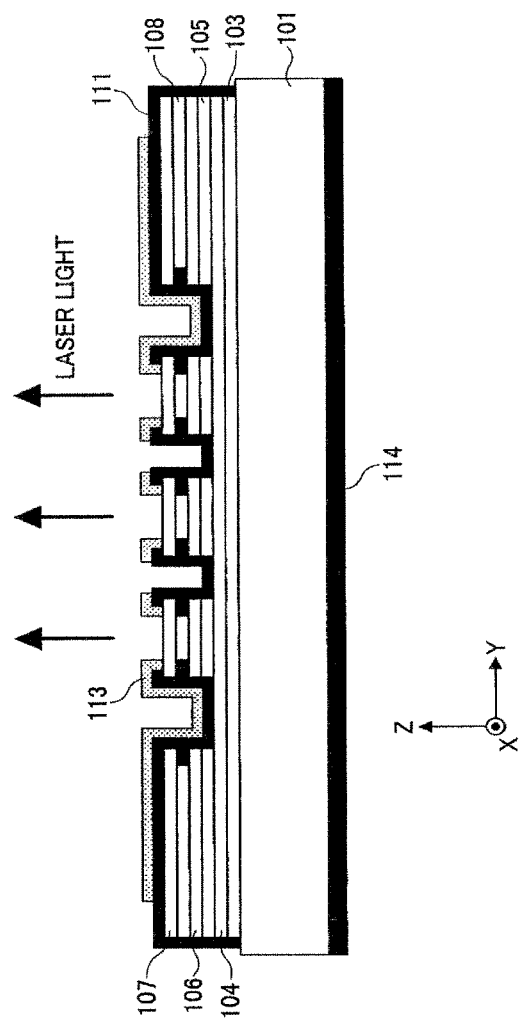

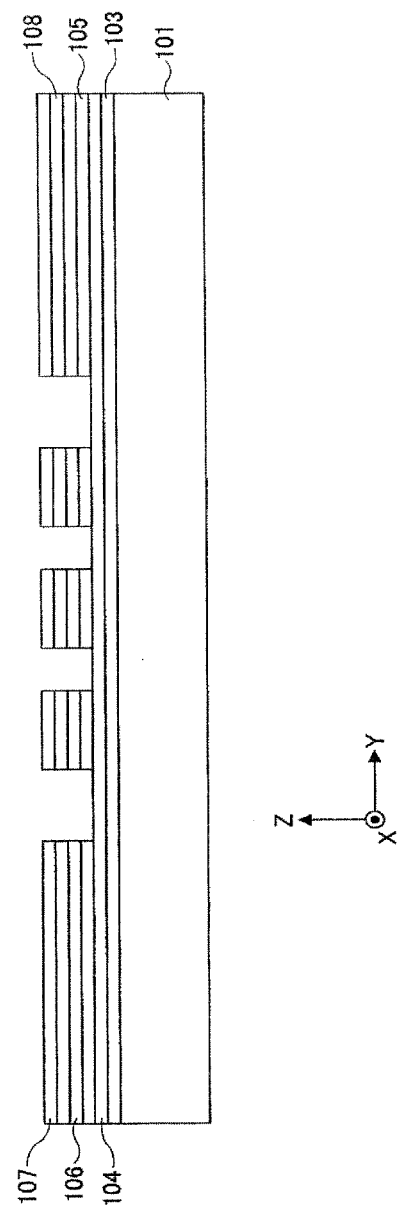

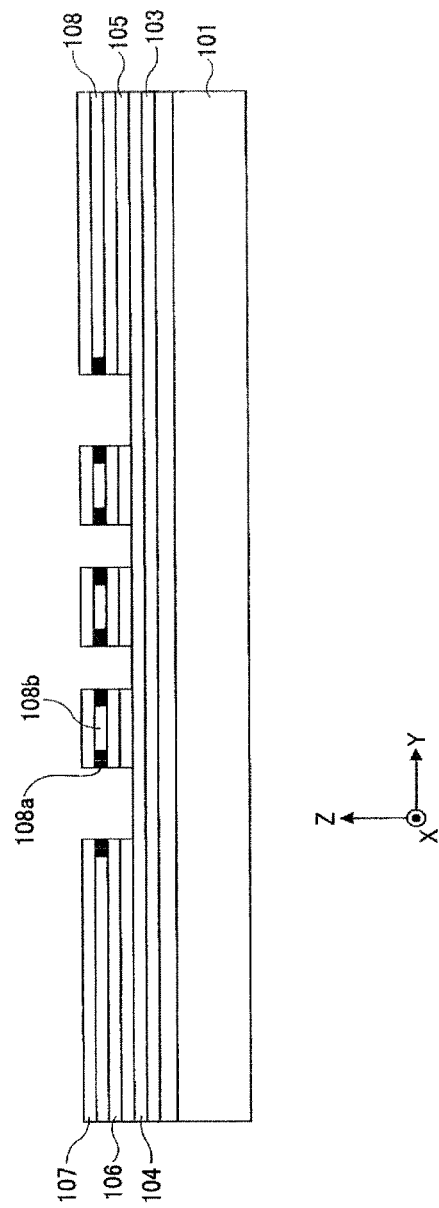

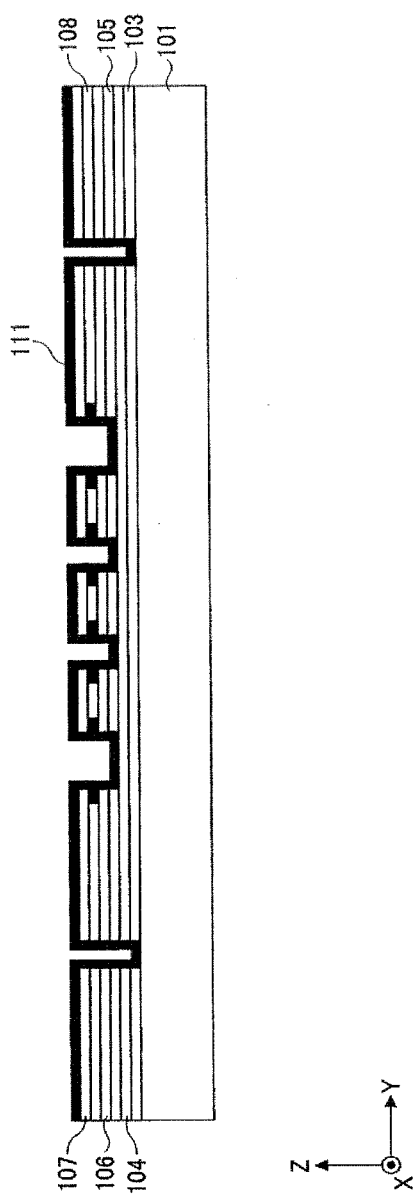

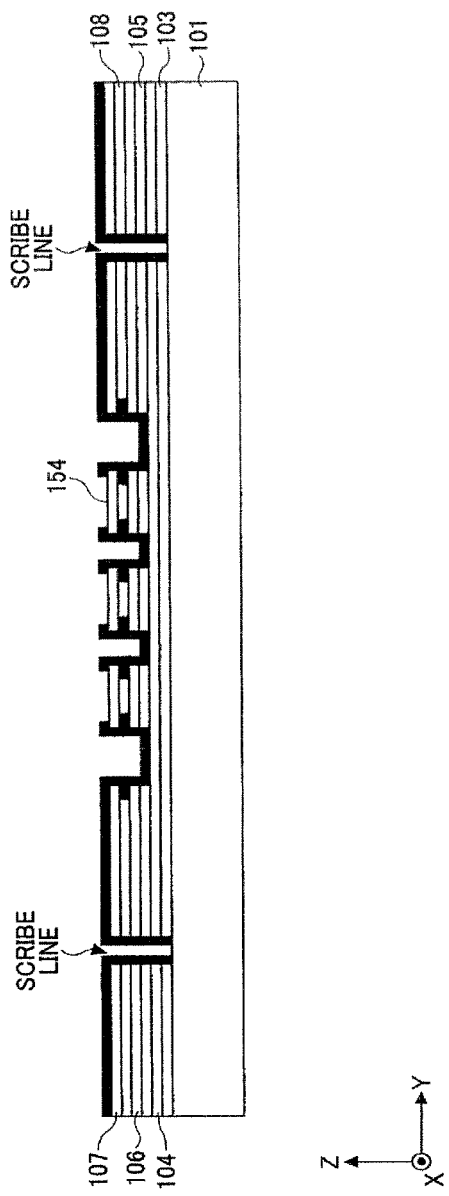

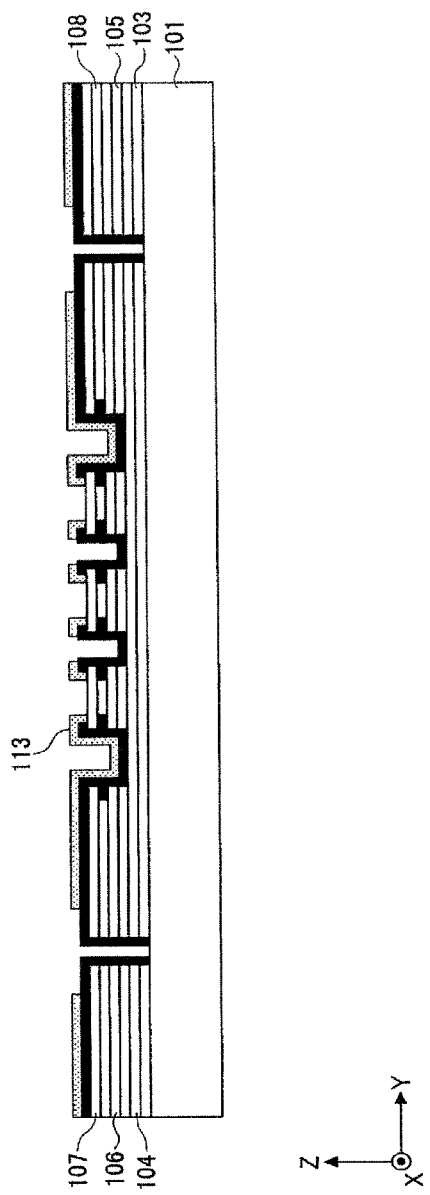

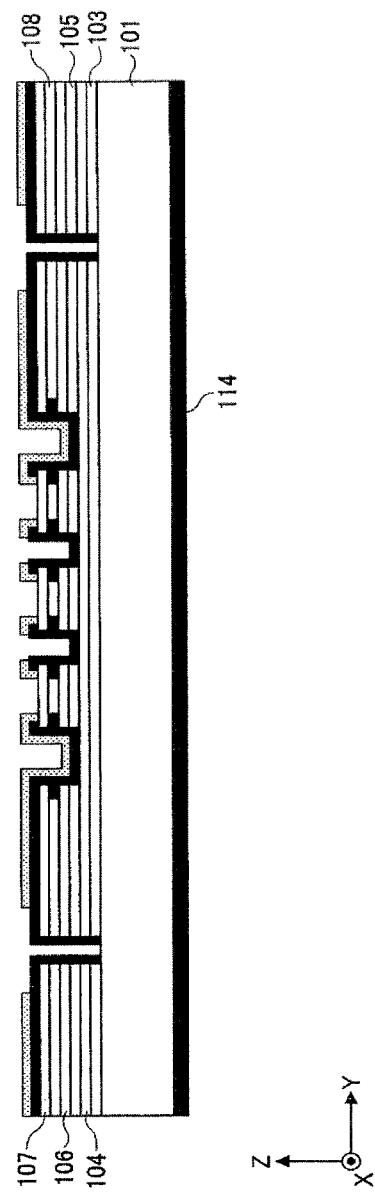

FIG.11D
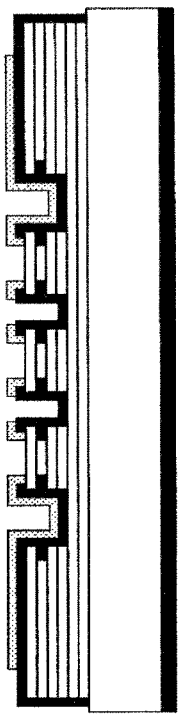
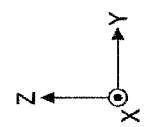

FIG.14B

RESULTS OF ELEMENTAL ANALYSIS WITH EDS (%)

| PLACE | N | O | Al | Si | As |
|---|---|---|---|---|---|
| ① | 0 | 2.23 | 47.93 | 0 | 49.84 |
| ② | 0 | 44.78 | 27.17 | 0 | 28.05 |
| ③ | 0 | 64.48 | 34.23 | 0 | 1.295 |
| ④ | 49.55 | 1.69 | 0.03 | 48.59 | 0.16 |

FIG.16

| SITE | | CONTENT (at%) | | |
|---|---|---|---|---|
| | | Al | As | O |
| HEAT RADIATING LAYER (AlAs) | | 49.8 | 46.4 | 2.9 |
| | As rich LAYER | 30.7 | 18.8 | 45.0 |
| | As poor LAYER | 30.2 | 9.5 | 54.5 |

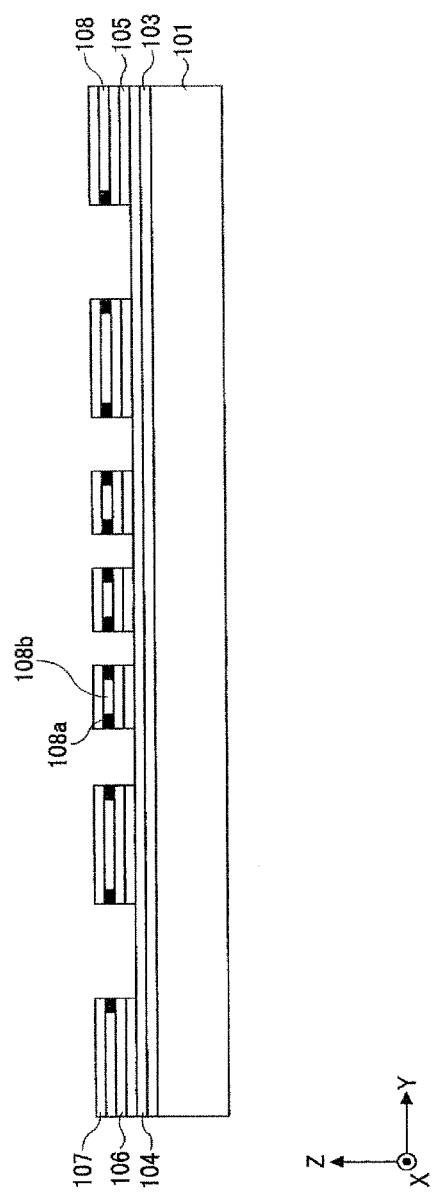

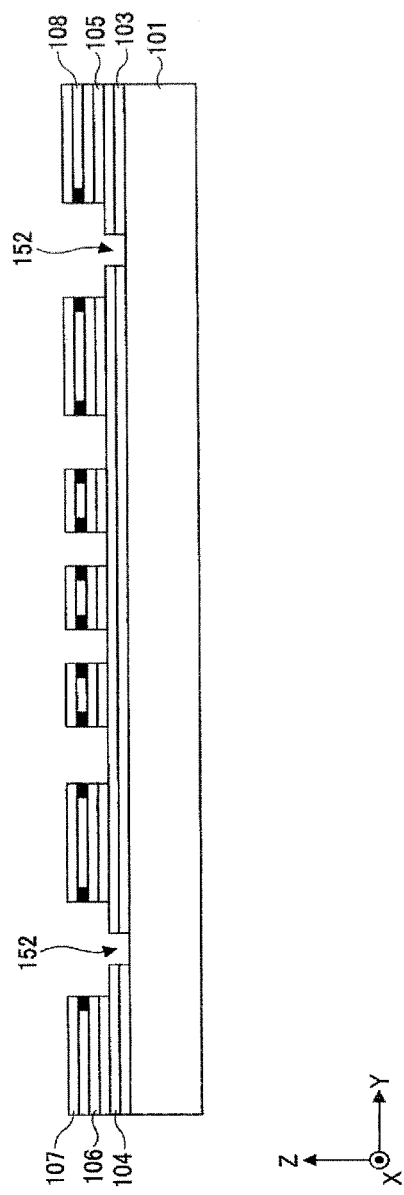

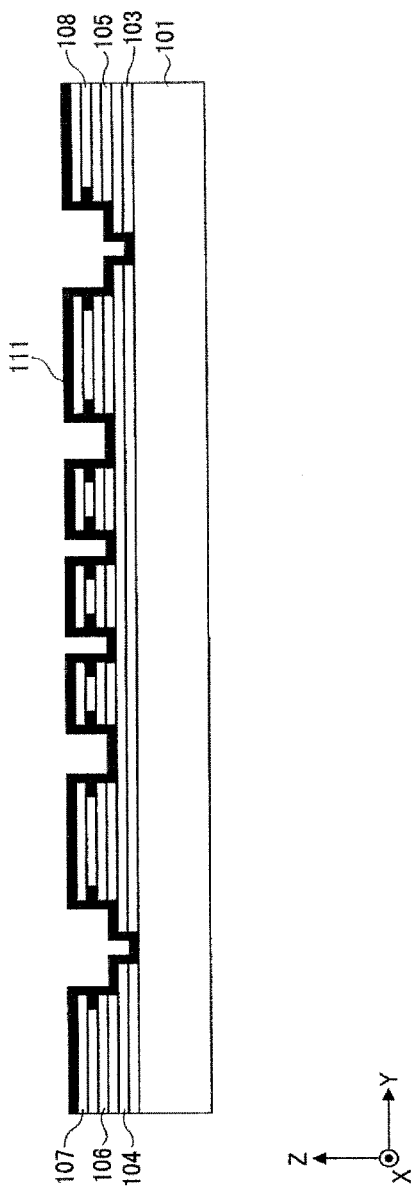

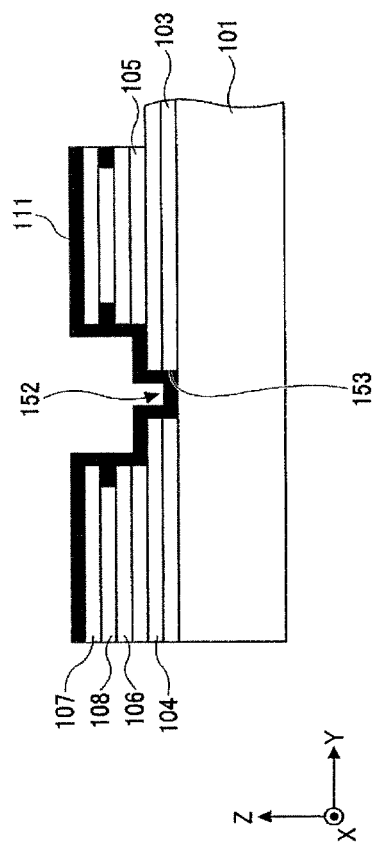

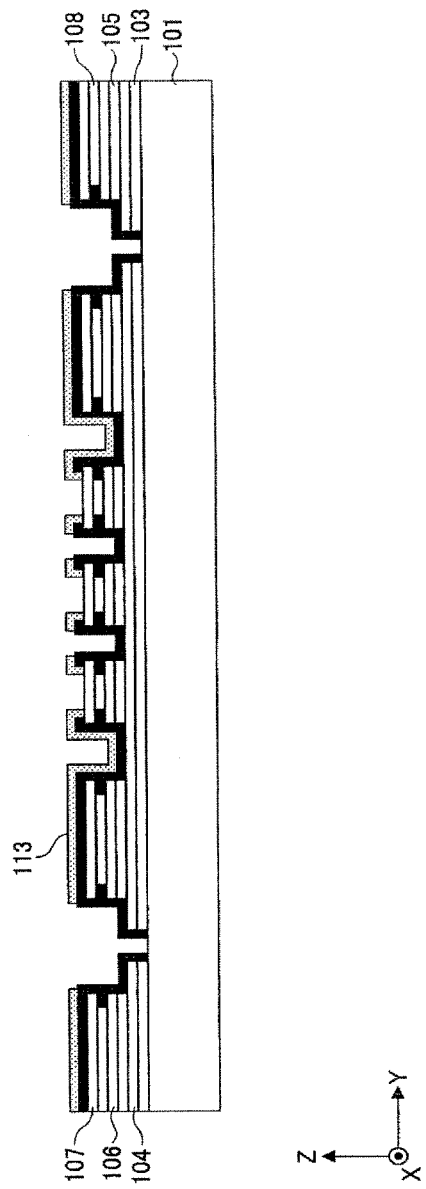

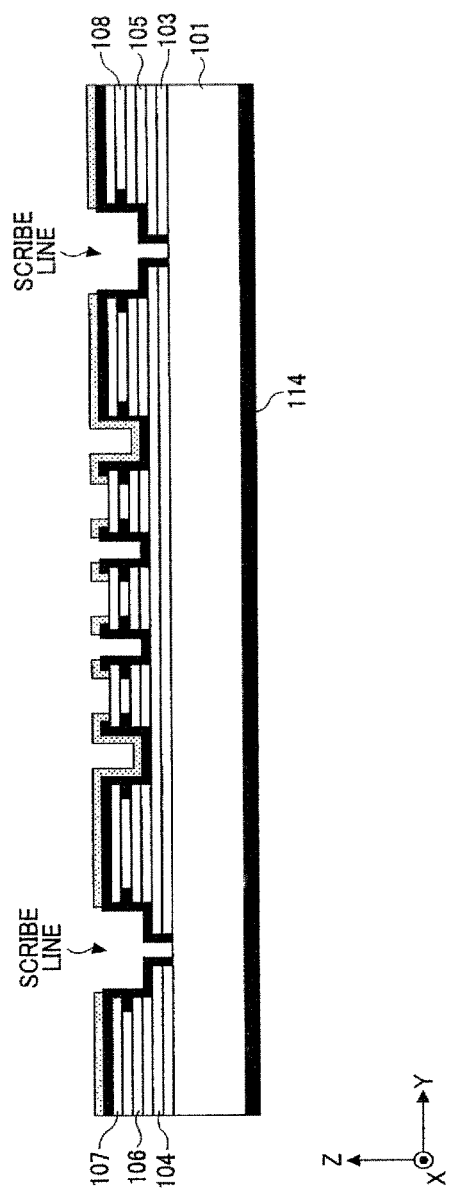

MANUFACTURING METHOD, SURFACE-EMITTING LASER DEVICE, SURFACE-EMITTING LASER ARRAY, OPTICAL SCANNER, AND IMAGE FORMING APPARATUS

CROSS-REFERENCE TO RELATED APPLICATIONS

This application is a divisional of U.S. application Ser. No. 13/127,531 filed on May 4, 2011 as a Section 371 national stage of International Application No. PCT/JP2009/069596 filed on Nov. 12, 2009 which claims the priority of Japanese Patent Applications Nos. 2008-296195, 2009-098657 and 2009-230090 filed with the Japanese Patent Office on Nov. 20, 2008, Apr. 15, 2009 and Oct. 2, 2009, respectively.

TECHNICAL FIELD

The present invention relates to manufacturing methods, surface-emitting laser devices, surface-emitting laser arrays, optical scanners, and image forming apparatuses and, more specifically, to a manufacturing method for manufacturing a surface-emitting laser device, a surface-emitting laser device that emits laser light in a direction perpendicular to a substrate, a surface-emitting laser array, an optical scanner having the surface-emitting laser device or the surface-emitting laser array, and an image forming apparatus having the optical scanner.

BACKGROUND ART

A vertical cavity surface-emitting laser (VCSEL) device is a semiconductor laser device that emits light in a direction perpendicular to a substrate and has received attention due to its (1) competitive price, (2) low power consumption, (3) small size and high performance, and (4) ease of two-dimensional integration when compared with an end-surface-emitting semiconductor laser device that emits light in a direction parallel to the substrate.

The surface-emitting laser device has a constriction structure so as to improve a current inflow efficiency. As the constriction structure, a constriction structure (hereinafter also referred also to as an "oxidized constriction structure" for convenience sake) obtained by selectively oxidizing an Al (aluminum) As (arsenic) layer is generally used. The oxidized constriction structure is manufactured in the following manner. That is, a predetermined size of mesas having a selective oxidized layer made of p-AlAs exposed at their side surfaces are formed and then placed in a high-temperature steam atmosphere to selectively oxidize Al from the side surfaces of the mesas. With the oxidation of the Al, non-oxidized regions are formed in the selective oxidized layer near the centers of the mesas. The non-oxidized regions are regions (current injection regions) through which the driving current of the surface-emitting device passes. Thus, current constriction is easily made possible. The refractive index of the layer where Al is oxidized ($Al_xO_y$) in the oxidized constriction structure is about 1.6, which is smaller than that of a semiconductor layer. Accordingly, since a difference in the refractive index in a traverse direction occurs in a resonator structure and light is trapped at the centers of the mesas, a light-emitting efficiency can be improved. As a result, excellent characteristics such as a low threshold current and a high efficiency can be realized.

Meanwhile, since the surface-emitting laser device is susceptible to humidity (water), various countermeasures have been taken (see, for example, Patent Documents 1 through 3). Furthermore, the surface-emitting laser device can suppress the rise in a junction temperature (active-layer temperature), reduce a gain drop, and obtain a high output by immediately discharging the heat generated in an active layer (see, for example, Patent Document 4).

With the countermeasures disclosed in Patent Documents 1 however, demanded reliability may not be obtained.

Disclosure of Invention

According to a first aspect of the present invention, there provided a manufacturing method for manufacturing a surface-emitting laser device that emits laser light in a direction perpendicular to a substrate. The manufacturing method includes a step of forming a laminated body in which a lower reflecting mirror, a resonator structure including an active layer, and an upper reflecting layer having a selective oxidized layer are laminated on the substrate; a step of etching the laminated body to form a mesa structure having the selective oxidized layer exposed at side surfaces thereof; a step of selectively oxidizing the selective oxidized layer from the side surfaces of the mesa structure to form a constriction structure in which a current passing region is surrounded by an oxide; a step of forming a separating groove at a position away from the mesa structure; a step of passivating an outermost front surface of at least a part of the laminated body exposed when the separating groove is formed; and a step of coating a passivated part with a dielectric body.

According to a second aspect of the present invention, there is provided a surface-emitting laser device that includes a laminated body in which a lower reflecting mirror, a resonator structure including an active layer, and an upper reflecting mirror having a selective oxidized layer are laminated on a substrate; a light-emitting part composed of a mesa structure formed by grooves for constituting a constriction structure in which a current passing region is surrounded by an oxide obtained by selectively oxidizing side surfaces of the selective oxidized layer; and a separating groove formed at a position away from the mesa structure. An outermost front surface of a side surface of at least a part of the laminated body exposed when the separating groove is formed is passivated.

According to a third aspect of the present invention, there is provided a surface-emitting laser array into which the surface-emitting laser device described above is integrated.

According to a fourth aspect of the present invention, there is provided a first optical scanner that scans a surface to be scanned with light. The first optical scanner includes a light source having the surface-emitting laser device described above; a deflector that deflects light from the light source; and a scanning optical system that condenses the light deflected by the deflector onto the surface to be scanned.

According to a fifth aspect of the present invention, there is provided a second optical scanner that scans a surface to be scanned with light. The second optical scanner includes a light source having the surface-emitting laser array described above; a deflector that deflects light from the light source; and a scanning optical system that condenses the light deflected by the deflector onto the surface to be scanned.

According to a sixth aspect of the present invention, there is provided an image forming apparatus that includes at least one image carrier; and at least the one optical scanner described above that scans the at least one image carrier with light modulated in accordance with image information.

BRIEF DESCRIPTION OF DRAWINGS

FIG. 4 is a diagram showing a cross section taken along the line A-A in FIG. 3;

FIGS. 7A through 7C are diagrams (I) for explaining a method for manufacturing the surface-emitting laser array;

FIGS. 10A through 10D are diagrams (IV) for explaining the method for manufacturing the surface-emitting laser array;

FIGS. 11A through 11O are diagrams (V) for explaining the method for manufacturing the surface-emitting laser array;

FIGS. 14A and 14B show a part where an elemental analysis is carried out by Energy-Dispersive X-ray Spectroscopy (EDS) and results of the elemental analysis by the EDS, respectively;

FIG. 16 is a diagram showing results obtained by carrying out the elemental analysis by the EDS with respect to the heat radiating layer, an As poor layer, and an As rich layer;

FIGS. 18A through 18D are diagrams (I) for explaining a modification of the method for manufacturing the surface-emitting laser array;

FIGS. 19A through 19C are diagrams (II) for explaining a modification of the method for manufacturing the surface-emitting laser array;

FIGS. 20A through 20C are diagrams (III) for explaining a modification of the method for manufacturing the surface-emitting laser array.

BEST MODE FOR CARRYING OUT THE INVENTION

Figure 1:
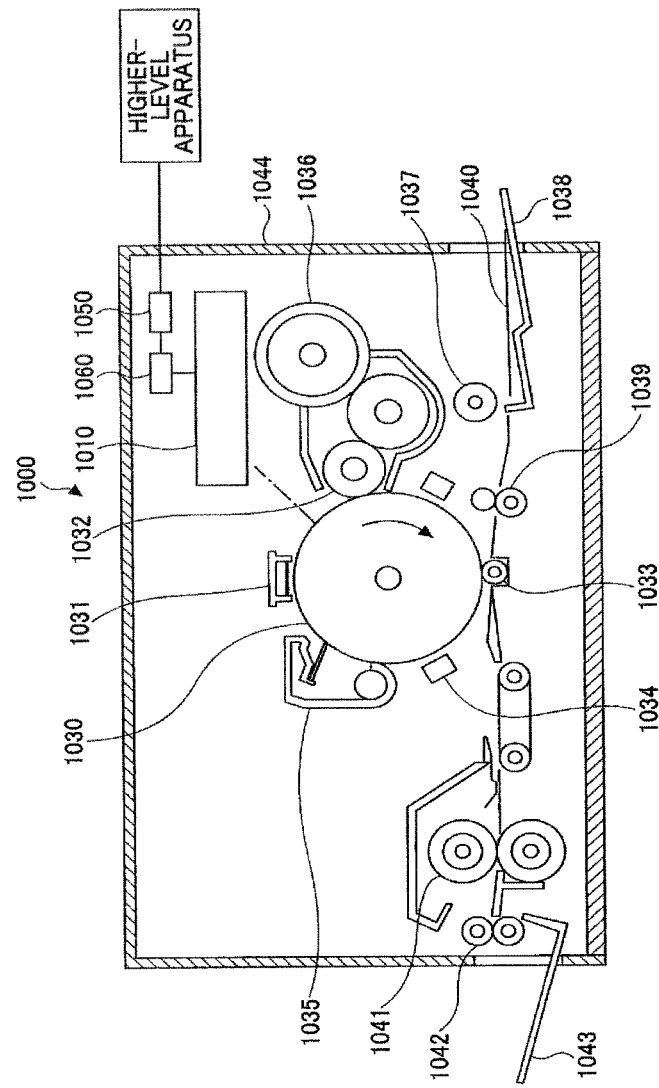
FIG. 1 is a diagram for explaining the schematic configuration of a laser printer according to an embodiment of the present invention.

Next, an embodiment of the present invention is described below with reference to FIGS. 1 through 12. FIG. 1 shows the schematic configuration of a laser printer 1000 serving as an image forming apparatus according to the embodiment.

The laser printer 1000 has an optical scanner 1010, a photosensitive drum 1030, an electrifying charger 1031, a developing roller 1032, a transfer charger 1033, a charge removing unit 1034, a cleaning unit 1035, a toner cartridge 1036, a sheet feeding roller 1037, a sheet feeding tray 1038, a pair of resist rollers 1039, a fixing roller 1041, a sheet discharging roller 1042, a sheet catching tray 1043, a communication control unit 1050, a printer control unit 1060 that collectively controls the above units, and the like. Note that these units are accommodated at predetermined positions in a printer housing 1044.

The communication control unit 1050 controls interactive communications with a higher-level apparatus (for example, a personal computer) via a network or the like.

The photosensitive drum 1030 is a cylindrical member having a photosensitive layer at its front surface. In other words, the front surface of the photosensitive drum 1030 is a surface to be scanned. The photosensitive drum 1030 rotates in the direction as indicated by an arrow in FIG. 1.

The electrifying charger 1031, the developing roller 1032, the transfer charger 1033, the charge removing unit 1034, and the cleaning unit 1035 are arranged near the front surface of the photosensitive drum 1030 and arranged in this order along the rotating direction of the photosensitive drum 1030.

The electrifying charger 1031 uniformly charges the front surface of the photosensitive drum 1030.

The optical scanner 1010 scans the front surface of the photosensitive drum 1030 charged by the electrifying charger 1031 with a light flux modulated in accordance with image information from the higher-level apparatus and forms a latent image corresponding to the image information on the front surface of the photosensitive drum 1030. The formed latent image moves in the direction of the developing roller 1032 along with the rotation of the photosensitive drum 1030. Note that the configuration of the optical scanner 1010 is described below.

The toner cartridge 1036 stores toner, which is supplied to the developing roller 1032.

The developing roller 1032 attaches the toner supplied from the toner cartridge 1036 to the latent image formed on the front surface of the photosensitive drum 1030 to form the image information. The latent image attached with the toner (hereinafter referred also to be as a "toner image" for convenience sake) moves in the direction of the transfer charger 1033 along with the rotation of the photosensitive drum 1030.

The sheet feeding tray 1038 stores recording sheets 1040. The sheet feeding roller 1037 is arranged near the sheet feeding tray 1038. The sheet feeding roller 1037 picks up the recording sheets 1040 one by one from the sheet feeding tray 1038 and conveys them to the pair of resist rollers 1039. The pair of resist rollers 1039 temporarily hold the recording sheet 1040 picked up by the sheet feeding roller 1037 while feeding the recording sheet 1040 to a gap between the photosensitive drum 1030 and the transfer charger 1033 along with the rotation of the photosensitive drum 1030.

In order to electrically attract the toner on the front surface of the photosensitive drum 1030 to the recording sheet 1040, a voltage having a polarity opposite to that of the toner is applied to the transfer charger 1033. With this voltage, the toner image on the front surface of the photosensitive drum 1030 is transferred to the recording sheet 1040. The recording sheet 1040 on which the toner image is transferred is fed to the fixing roller 1041.

The fixing roller 1041 applies heat and pressure to the recording sheet 1040 to fix the toner onto the recording sheet 1040. The recording sheet 1040 onto which the toner is fixed is fed to the sheet catching tray 1043 through the sheet discharging roller 1042 and stacked on the sheet catching tray 1043.

The charge removing unit 1034 removes the charge on the front surface of the photosensitive drum 1030.

The cleaning unit 1035 eliminates the toner (remaining toner) remaining on the front surface of the photosensitive drum 1030. The front surface of the photosensitive drum 1030, from which the remaining toner is eliminated, returns to the position opposing the electrifying charger 1031 again.

Next, the configuration of the optical scanner 1010 is described.

Figure 2:
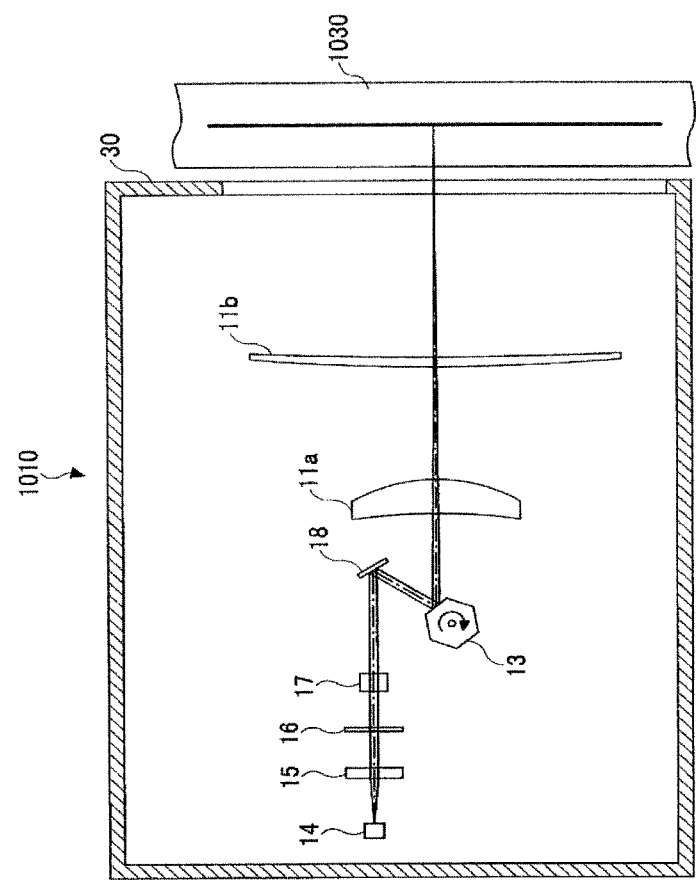
FIG. 2 is a schematic diagram showing an optical scanner in FIG. 1.

As shown in FIG. 2 as an example, the optical scanner 1010 has a deflector-side scanning lens 11a, an image-surface-side scanning lens 11b, a polygon mirror 13, a light source 14, a coupling lens 15, an apertured plate 16, a cylindrical lens 17, a reflecting mirror 18, a scanning control unit (not shown), and the like. These components are assembled at predetermined positions in an optical housing 30.

Note that in the following description, a direction corresponding to a main scanning direction is briefly described as a "main-scanning corresponding direction," and a direction corresponding to a sub-scanning direction is briefly described as a "sub-scanning corresponding direction" for convenience sake.

The coupling lens 15 converts a light flux output from the light source 14 into substantially parallel light.

The apertured plate 16 has an apertured part, which defines the beam diameter of the light flux through the coupling lens 15.

The cylindrical lens 17 forms the image of the light flux, which has passed through the apertured part of the apertured plate 16, near the deflecting and reflecting surface of the polygon mirror 13 through the reflecting mirror 18 in the sub-scanning corresponding direction.

An optical system arranged on a light path between the light source 14 and the polygon mirror 13 is called a pre-deflector optical system. In this embodiment, the pre-deflector optical system is composed of the coupling lens 15, the apertured plate 16, the cylindrical lens 17, and the reflecting mirror 18.

The polygon mirror 13 has as en example a six-surface mirror in which the radius of an inscribed circle is 18 mm, and each mirror serves as the deflecting and reflecting surface. The polygon mirror 13 deflects the light flux from the reflecting mirror 18 while rotating about a shaft parallel to the sub-scanning corresponding direction at equal speed.

The deflector-side scanning lens 11a is arranged on the light path of the light flux deflected by the polygon mirror 13.

The image-surface-side scanning lens 11b is arranged on the light path of the light flux through the deflector-side scanning lens 11a. The light flux through the image-surface-side scanning lens 11b is applied to the front surface of the photosensitive drum 1030 to form a light spot. The light spot moves in the longitudinal direction of the photosensitive drum 1030 along with the rotation of the polygon mirror 13. In other words, the light spot scans the photosensitive drum 1030. The movement direction of the light spot at this time is the "main scanning direction." Furthermore, the rotating direction of the photosensitive drum 1030 is the "sub-scanning direction."

An optical system arranged on the light path between the polygon mirror 13 and the photosensitive drum 1030 is called a scanning optical system. In this embodiment, the scanning optical system is composed of the deflector-side scanning lens 11a and the image-surface-side scanning lens 11b. Note that at least one turning-back mirror may be arranged on at least one of the light path between the deflector-side scanning lens 11a and the image-surface-side scanning lens 11b and the light path between the image-surface-side scanning lens 11b and the photosensitive drum 1030.

Figure 3:
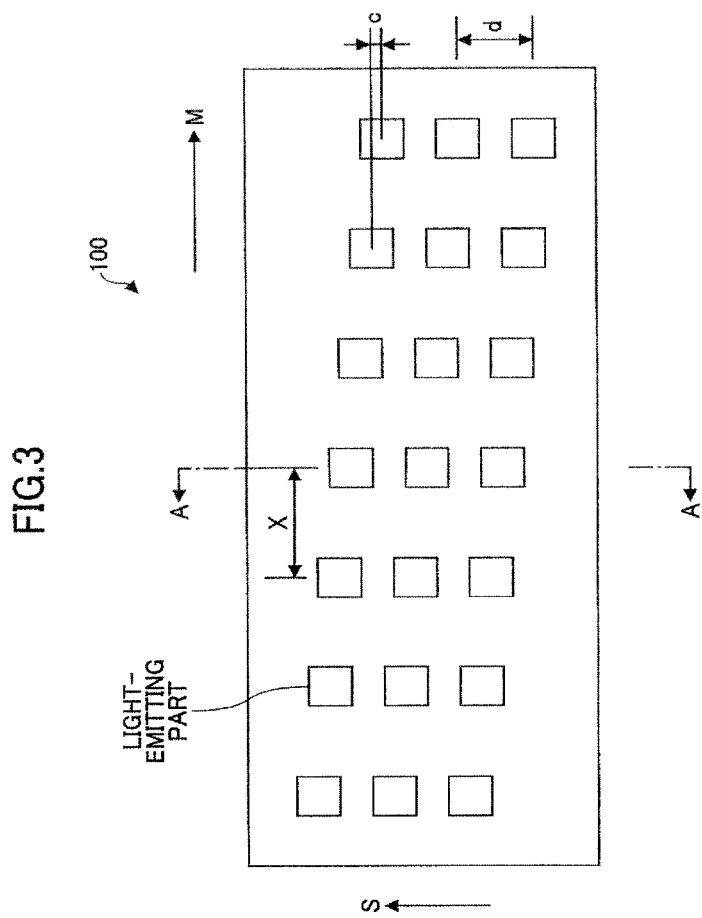
FIG. 3 is a diagram for explaining a surface-emitting laser array included in a light source in FIG. 2.

As shown in FIG. 3 as an example, the light source 14 has a surface-emitting laser array 100. In the surface-emitting laser array 100, 21 light-emitting parts are two-dimensionally arranged and formed on a substrate and emit laser light in a direction perpendicular to the substrate. In other words, vertical cavity surface-emitting laser devices are integrated into the surface-emitting laser array 100. The surface-emitting laser array 100 is a surface-emitting laser array having an oscillation wavelength of 780 nm. Note that in FIG. 3, the direction as indicated by M is the main-scanning corresponding direction, and the direction as indicated by S is the sub-scanning corresponding direction. Furthermore, in FIG. 3, wirings and electrode pads are omitted for convenience sake.

The 21 light-emitting parts of the surface-emitting laser array 21 are arranged such that an interval between the neighboring light-emitting parts becomes an equal interval c when all the light-emitting parts are orthogonally projected onto an imaginary line extending in the direction as indicated by S. Note that in this specification, the "interval between the light-emitting parts" is a distance between the centers of the two light-emitting parts. Accordingly, the front surface of the photosensitive drum 1030 can be scanned with 21 light fluxes at the same time.

A cross section taken along the line A-A in FIG. 3 is shown in FIG. 4. Note that in this specification, a laser oscillating direction is defined as a Z-axis direction, and two directions orthogonal to each other inside a plane perpendicular to the Z-axis direction are defined as an X-axis direction and a Y-axis direction, respectively.

The surface-emitting laser array 100 has a substrate 101, a lower semiconductor DBR 103, a lower spacer layer 104, an active layer 105, an upper spacer layer 106, an upper semiconductor DBR 107, and the like.

Figure 5A:
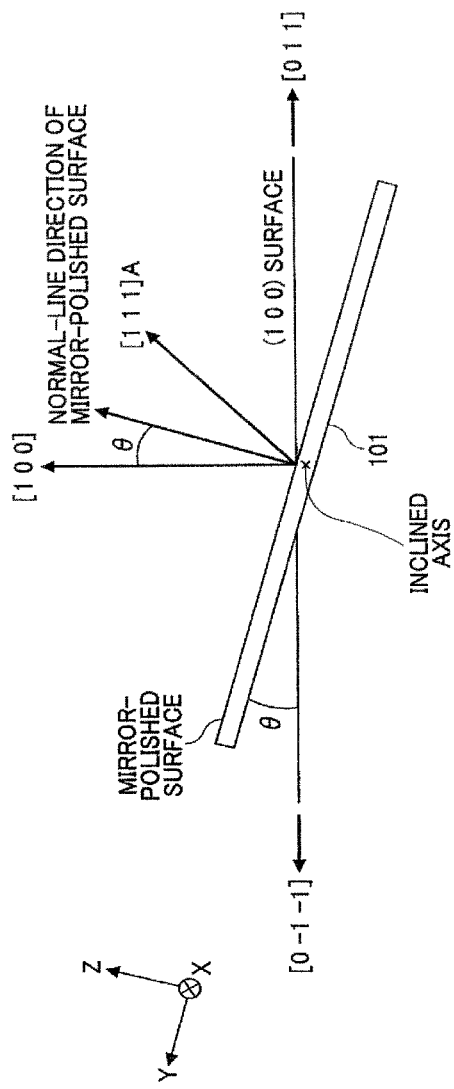
FIGS. 5A and 5B are diagrams for explaining an inclined substrate.
Figure 5B:
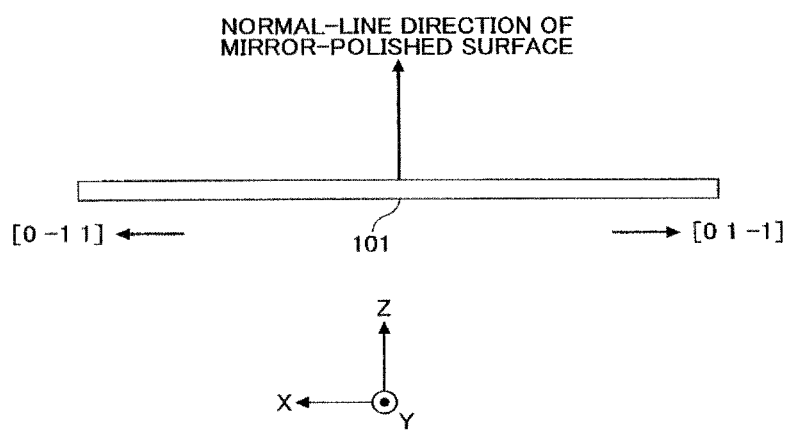

The substrate 101 has a mirror-polished surface as its front surface. As shown in FIG. 5A, the substrate 101 is an n-GaAs single-crystal substrate in which the normal-line direction of the mirror-polished surface is inclined by 15 degrees ($\theta=15$ degrees) toward a crystal orientation [1 1 1] A direction relative to a crystal orientation [1 0 0] direction. In other words, the substrate 101 is a so-called inclined substrate. Here, as shown in FIG. 5B, the normal-line direction of the mirror-polished surface is arranged such that a crystal orientation [0 1 −1] direction is defined as a negative X-direction, and a crystal orientation [0 −1 1] direction is defined as a positive X-direction.

Figure 6:
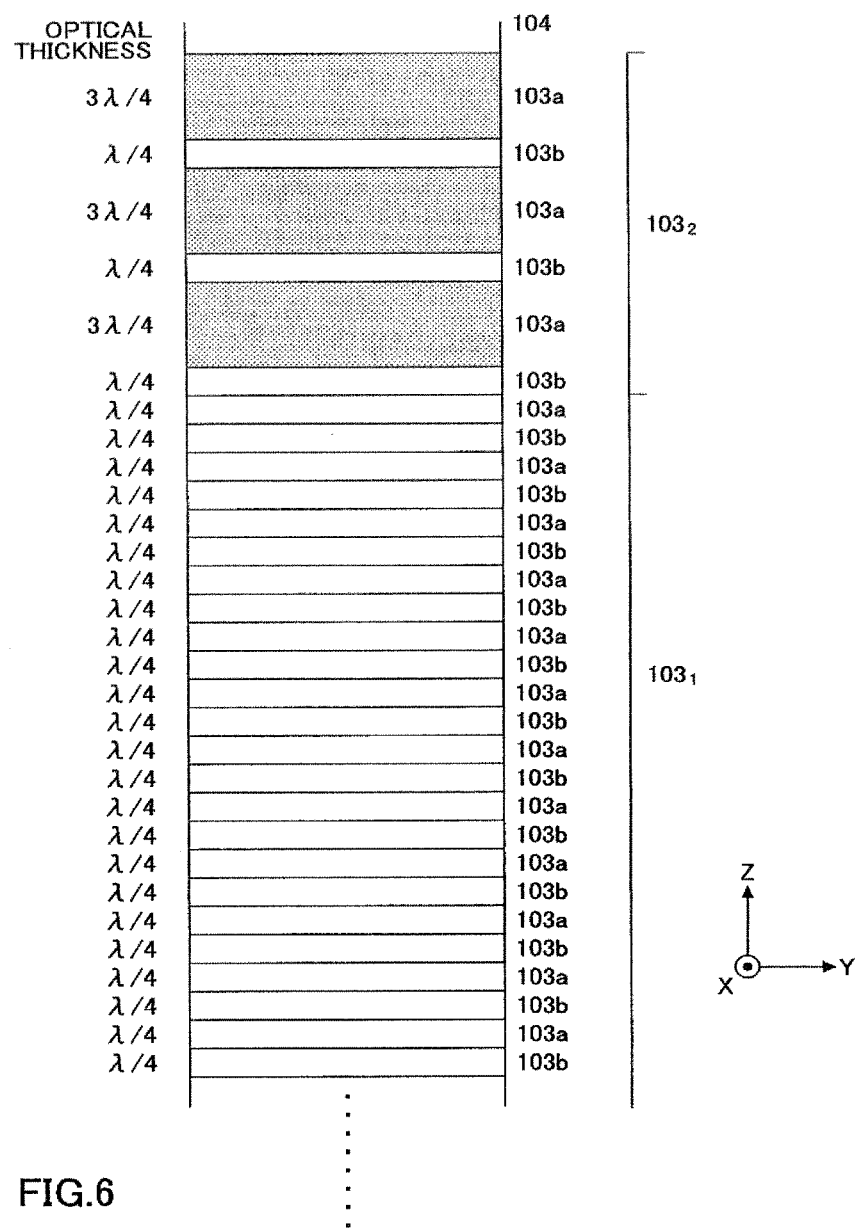
FIG. 6 is a diagram for explaining a lower semiconductor DBR.

As shown in FIG. 6 as an example, the lower semiconductor DBR 103 has a first lower semiconductor DBR 103$_1$ and a second lower semiconductor DBR 103$_2$.

The first lower semiconductor DBR 103$_1$ is laminated on the positive Z-side of the substrate 101 through a buffer layer (not shown). The first Lower semiconductor DBR 103$_1$ has 37.5 pairs of low refractive-index layers 103a made of n-Al$_{0.9}$Ga$_{0.1}$As and high refractive-index layers 103b made of n-Al$_{0.3}$Ga$_{0.7}$As. In order to reduce electric resistance, a composition inclined layer (not shown) having a thickness of 20 nm, in which compositions are gradually changed from one to the other, is provided between the respective refractive-index layers. Each of the refractive-index layers is set in such a manner as to have an optical thickness of $\lambda/4$ including ½ of the neighboring composition inclined layer assuming that an oscillating wavelength is $\lambda$. Note that there is a relationship between the optical thickness and the actual thickness of a Layer as follows. When the optical thickness is $\lambda/4N$, the actual thickness D of the layer is expressed by $D=\lambda/4$ (where N is the refractive index of the medium of the layer).

The second lower semiconductor DBR $103_2$ is laminated on the positive Z-side of the first lower semiconductor DBR $103_1$ and has 3 pairs of the low refractive-index layers $103a$ and the high refractive-index layers $103b$. In order to reduce electric resistance, a composition inclined layer (not shown), in which compositions are gradually changed from one to the other, is provided between the respective refractive-index layers. The low refractive-index layers $103a$ are set in such a manner as to have an optical thickness of $3\lambda/4$ including ½ of the neighboring composition inclined layer. The high refractive-index layers $103b$ are set in such a manner as to have an optical thickness of $\lambda/4$ including ½ of the neighboring composition inclined layer. The second lower semiconductor PER $103_2$ is a so-called "heat radiating structure." Furthermore, the low refractive-index layer $103a$ of the second lower semiconductor DBR $103_2$ is a so-called "heat radiating layer."

Referring back to FIG. 4, the lower spacer layer 104 is laminated on the positive Z-side of the lower semiconductor DBR 103 and made of non-doped $Al_{0.6}Ga_{0.4}As$.

The active layer 105 is laminated on the positive Z-side of the lower spacer layer 104 and has three quantum well layers and four barrier layers. Each of the quantum well layers is made of $Al_{0.12}Ga_{0.88}As$, and each of the barrier layers is made of $Al_{0.3}Ga_{0.7}As$.

The upper spacer layer 106 is laminated on the positive Z-side of the active layer 105 and made of non-doped $Al_{0.6}Ga_{0.4}As$.

A part composed of the lower spacer layer 104, the active layer 105, and the upper spacer layer 106 is called a resonator structure and set in such a manner as to have an optical thickness of one wavelength. Note that the active layer 105 is provided at the center of the resonator structure, which corresponds to the antinode of a stationary wave distribution in an electric field, so as to obtain a high stimulated emission probability.

Furthermore, the heat generated at the active layer 105 is mainly radiated to the substrate 101 through the lower semiconductor DBR 103. The rear surface of the substrate 101 is attached to a package with a conductive adhesive or the like. The heat is radiated from the substrate 101 to the package.

The upper semiconductor DBR 107 is laminated on the positive Z-side of the upper spacer layer 106 and has 24 pairs of low refractive-index layers made of $p-Al_{0.9}Ga_{0.1}As$ and high refractive-index layers made of $p-Al_{0.3}Ga_{0.7}As$. In order to reduce electric resistance, a composition inclined layer, in which compositions are gradually changed from one to the other, is provided between the respective refractive-index layers. Each of the refractive-index layers is set in such a manner as to have an optical thickness of ¾ including ½ of the neighboring composition inclined layer.

At the position optically $\lambda/4$ away from the resonator structure in the upper semiconductor DBR, a selective oxidized layer 108 made of p-AlAs is provided. Note that in FIG. 4, the selective oxidized layer 108 is provided between the upper semiconductor OCR 107 and the resonator structure for convenience sake.

In the following description, one having the plural semiconductor layers laminated on the substrate 101 as described above is called a "laminated body" for convenience sake.

Next, a manufacturing method for manufacturing the surface-emitting laser array 100 is described.

Figure 7A:
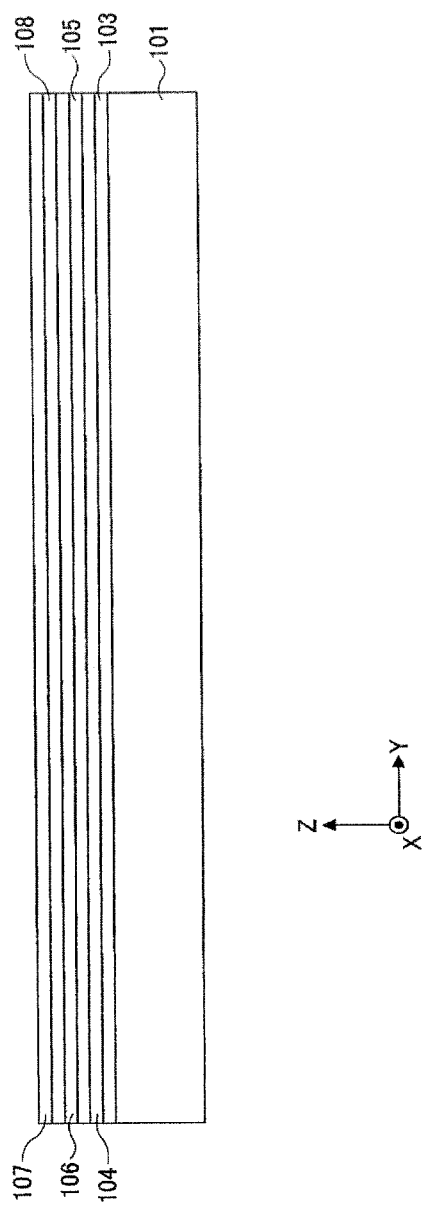

(1) The laminated body is formed by crystal growth using an organic metal vapor growing method (MOCVD method) or a molecular beam epitaxial growing method (MBE method) (see FIG. 7A).

Here, trimethyl aluminum (TMA) and trimethyl gallium (TMG) are used as a group III material, and arsin ($AsH_3$) is used as a group V material. Furthermore, carbon tetrabromide ($CBr_4$) and dimethyl zinc (DMZn) are used as a p-type dopant material, and hydrogen selenide ($H_2Se$) is used as an n-type dopant material.

(2) On the front surface of the laminated body, resist patterns are provided for forming plural mesa structures (hereinafter briefly described as "mesas" for convenience sake) corresponding to the plural light-emitting parts. Here, as an example, the square-shaped resist patterns having a side of 20 μm are provided for parts serving as the mesas.

Furthermore, an interval between the neighboring mesas is preferably 5 μm or larger so as to electrically and spatially separate the respective light-emitting parts from one another. This is because etching control at the time of manufacturing the surface-emitting laser array becomes difficult if the interval is too small.

(3) Through the resist patterns as a photomask, the mesas are formed by an ECR etching method using $Cl_2$ gas. Here, an etched bottom surface is positioned at the upper surface of the lower spacer layer 104. Note that if the etched bottom surface reaches the second lower semiconductor DBR $103_2$, the heat radiating layer having a high level of Al compositions is oxidized in the following oxidation step. In order to avoid this, the etched bottom surface is required to penetrate deeper than the selective oxidized layer 108 and stop before reaching the heat radiating layer. Note that if an AlGaInP-system material is used as the lower spacer layer 104, the control of the etched bottom surface can be improved. Furthermore, the size (length of a side) of the mesas is preferably 10 μm or larger. This is because heat may be kept inside during operations and thus degrades characteristics of the mesas if the interval is too small.

(4) The photomask is removed (see FIG. 7B).

(5) The laminated body is heat-treated in vapor. Here, Al of the selective oxidized layer 108 is selectively oxidized from the peripheral parts of the mesas. Then, non-oxidized regions $108b$ surrounded by Al-oxidized layer $108a$ are caused to remain at the centers of the mesas (see FIG. 7C). Thus, the oxidized constriction structures are manufactured, which allow the driving current of the light-emitting to be supplied only at the centers of the mesas.

The non-oxidized regions $108b$ are the current passing regions (current injection regions). Here, conditions (such as holding temperature and holding time) of the heat treatment are appropriately selected to obtain the current passing regions 108 in desired sizes based on the results of various preliminary experiments.

Figure 8:
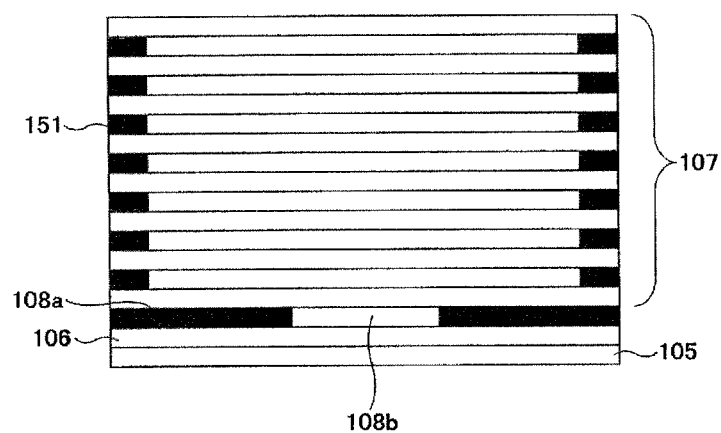
FIG. 8 is a diagram (II) for explaining the method for manufacturing the surface-emitting laser array.

At this time, as shown in FIG. 8 as an example, since the low refractive-index layers of the upper semiconductor DBR 107 exposed on the side surface of the mesa contain Al in large amounts, they are oxidized from their exposed parts. The oxidized parts of the oxidized low refractive-index layers are several tens of nm in length (depth). The oxidized parts 151 are called damage layers, which give large stress to the mesa and influence the service life of laser light. Note that the lengths of the oxidized parts depend on an Al composition ratio of the low refractive-index layers of the upper semiconductor DBR 107.

Figure 9:
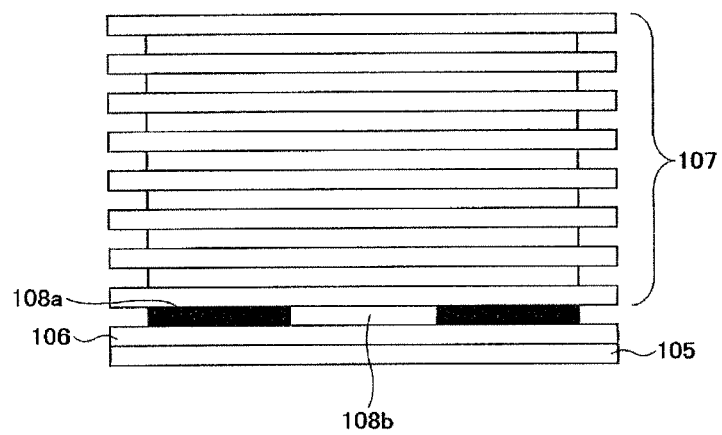
FIG. 9 is a diagram (III) for explaining the method for manufacturing the surface-emitting laser array.

(6) The side surfaces of the mesas are etched by a BHF (buffered hydrofluoric acid) for about 10 to 15 seconds. Thus, as shown in FIG. 9 as an example, the damage layers are removed. In other words, unnecessary oxides on the side surfaces of the mesa forming the oxide constriction structures are removed. Thus, stress due to oxidation is alleviated.

Meanwhile, the removal of the damage layers must be carried out in an appropriate etching time. The appropriate etching time depends on the Al composition ratio of the low refractive-index layers of the upper semiconductor DBR 107. If an etching time is too much longer than the appropriate etching time, the upper semiconductor DBR 107 may be cracked and broken. For this reason, if the appropriate etching time is not decided, the step of removing the damage layers may be omitted.

(7) A resist mask for forming grooves for separation (chip-cutting) is provided on the front surface of the laminated body.

(8) Using the resist mask described above as an etching mask, the grooves for separation (chip-cutting) are formed by a dry etching method.

Figure 10A:
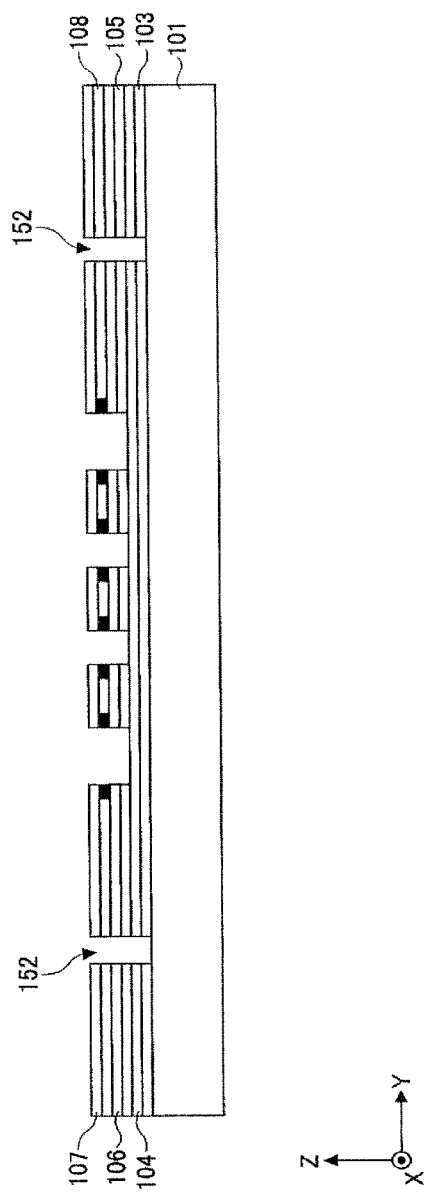

(9) The etching mask is removed (see FIG. 10A). Here, the grooves 152 reaching the substrate 101 are formed. Thus, the lower semiconductor DBR 103 is exposed.

(10) The laminated body is immersed in 5% ammonia water for 40 seconds.

(11) Passivation processing is carried out. Although two methods are described here, the following manufacturing method is the same in either method.

(11-1) The laminated body is placed in a chamber for heat treatment and held at a temperature of between 350° C. to 400° C. for three minutes in a nitrogen atmosphere. Here, it is conceived that a natural, oxide film, which is generated due to oxygen and water attached to the front surface of the laminated body in atmosphere or generated due to a small amount of oxygen and water of the chamber for heat treatment, is converted into a stable oxide film by heat treatment in a nitrogen atmosphere.

(11-2) The laminated body is placed in a chamber for heat treatment and held at a temperature of between 350° C. to 400° C. for 25 minutes in an atmosphere concurrently containing oxygen ($O_2$) and high-temperature vapor.

Figure 10B:
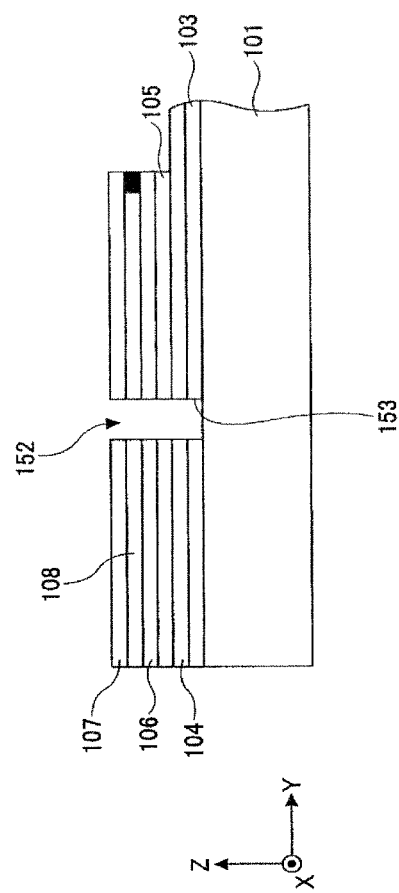

In either method, oxidation does not progress from the side surfaces of the exposed lower semiconductor DBR 103, and the outermost front surfaces of the laminated body are coated with a very thin and stable oxide film 153 (see FIG. 10B).

FIG. 10B is a diagram enlarging one of the parts in which the grooves are formed. The oxide film generated here is much thinner than an oxide film generated by a conventional oxidation process and excellent in adhesion to the lower semiconductor DBR 103. Furthermore, it is conceived that the oxide film generated here is a very precise oxide film which prevents the penetration of oxygen into the lower semiconductor DBR 103.

Figure 10D:
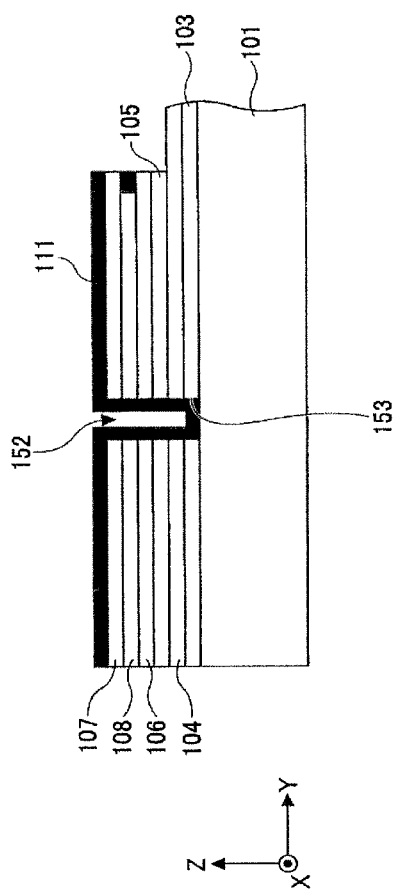

(12) Using a plasma CVD method, a passivation film 111, which is made of any one of SiN, SiON, and $SiO_2$ as a dielectric body and has a thickness of 150 nm through 300 nm, is formed (see FIG. 10C). At this time, as shown in FIG. 10D as an example, the oxide film 153 is also coated with the passivation film 111. FIG. 10D is a diagram enlarging one of the parts in which the grooves are formed.

Figure 12:
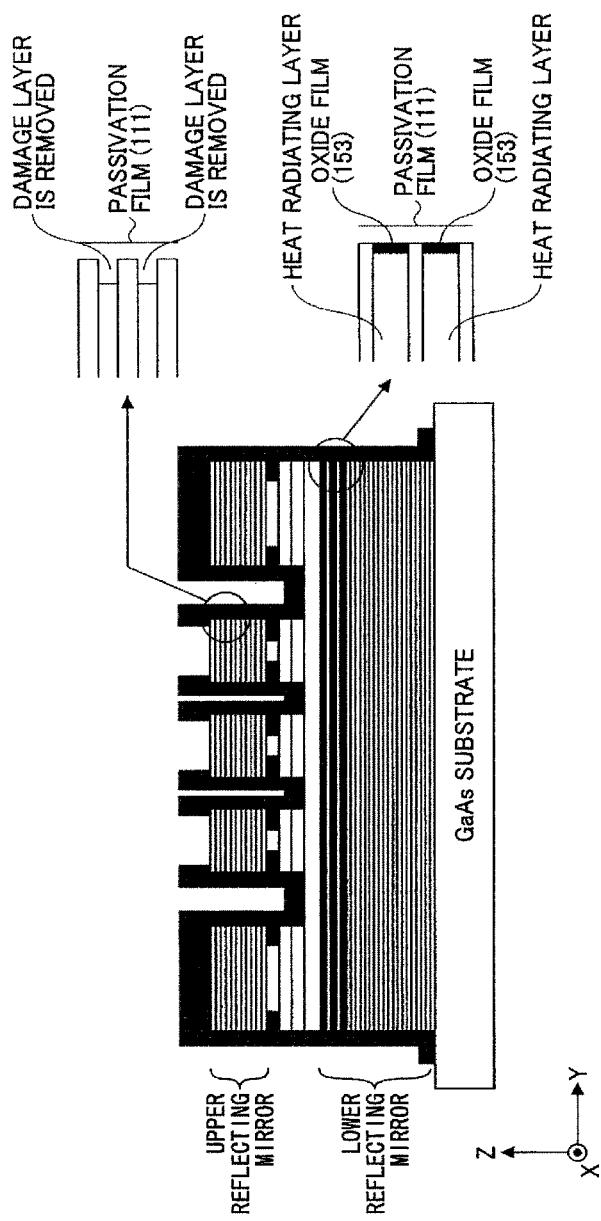
FIG. 12 is a diagram for explaining a positional relationship between the end surfaces of mesas of an upper reflecting mirror, where damage layers are removed, and the passivated end surfaces of a heat radiating layer of a lower reflecting surface.

(13) The scribe lines of the grooves 152 and the contact holes 154 of the upper parts of the mesas are formed (see FIG. 11A). FIG. 12 shows a positional relationship between the end surfaces of the mesas of the upper semiconductor DBR 107, where the damage layers are removed, and the passivated end surfaces of the heat layer of the lower semiconductor DBR 103.

(14) At regions serving as light-emitting parts on the upper parts of the mesas, square-shaped resist patterns having a side of 10 μm are formed, and a p-side electrode material is deposited. A multi-layer film made of Cr/AuZn/Au or a multi-layer film made of AuZn/Ti/Au is used as the p-side electrode material. Here, electrode pads and wiring members may be deposited at the same time.

(15) The electrode material of the emitting parts is lifted off to form p-side electrodes 113 (see FIG. 11B). Here, parts other than the electrodes are masked by a photoresist in advance. Then, after being deposited, the electrode material is subjected to ultrasonic cleaning in a solution, such as acetone where the photoresist is dissolved, to form the electrodes.

(16) After the rear side of the substrate 101 is polished by a predetermined thickness (for example, about 100 μm through 300 μm), an n-side electrode 114 is formed (see FIG. 11C). Here, the n-side electrode 114 is a multi-layer film made of AuGe/Ni/Au.

(17) Ohmic conduction between the p-side electrodes 113 and the n-side electrode 114 is obtained by annealing. Thus, the mesas are converted into the light-emitting parts.

(18) The scribe lines of the grooves 152 are subjected to dicing or scribing to cut out a chip (see FIG. 11D). Thus, the surface-emitting laser array 100 is completed.

When a high-temperature and high-humidity holding test was conducted in which plural surface-emitting laser arrays thus manufactured are left alone for 1000 hours in a container containing a high-temperature and high-humidity atmosphere having a temperature of 85° C. and a humidity of 85%, all the surface-emitting laser arrays were approved. Note that the plural surface-emitting laser arrays used in the high-temperature and high-humidity test include a sample in which the removal of the damage layers (step (6)) is omitted, a sample employing step (11-1) described above and a sample employing step (11-2) described above as the passivation processing.

On the other hand, when the same high-temperature and high-humidity holding test was conducted with respect to plural surface-emitting laser arrays manufactured by a conventional manufacturing method, about 6% of the plural surface-emitting laser arrays were approved. In other words, reliability can be enhanced by the manufacturing method according to the embodiment of the present invention.

As is apparent from the above, the manufacturing method according to the embodiment of the present invention is carried out as a manufacturing method for manufacturing the surface-emitting laser array 100.

In the surface-emitting laser array 100 according to the embodiment of the present invention, the lower semiconductor DBR 103, the lower spacer layer 104, the active layer 105, the upper spacer layer 106, and the upper semiconductor DBR 107 are laminated on the substrate 101. The outermost front surfaces of the side surfaces of the lower semiconductor DBR 103 are passivated by the stable oxide film. Furthermore, the passivated parts are coated with the passivation film 111 made of any one of SiN, SiON, and $SiO_2$ as a dielectric body. In this case, reliability can be further enhanced than before.

Meanwhile, a surface-emitting laser is susceptible to humidity (water). Through various experiments or the like, the present inventors have found that the heat radiating layer which contains a high level of Al and is thicker than other layers is particularly weak in water.

Moreover, according to a conventional manufacturing method, light etching is carried out for improving adhesion to the passivation film after the lower semiconductor DBR is exposed. However, the present inventors have conducted various experiments or the like and found the following fact. In other words, when the exposed surfaces of the lower semiconductor DBR are caused to have irregularities by the light etching, the irregularities may not be sufficiently coated with the passivation film at parts where the layer is thick even if the film thickness of the passivation film and film-deposition conditions are changed. As a result, water penetrates into parts where the irregularities are not sufficiently coated with the passivation film, and the parts are oxidized to cause the breakage of a chip.

According to the embodiment of the present invention, the light etching is not carried out, but the passivation processing is carried out. In this case, since the light etching is not carried out, the exposed surfaces of the lower semiconductor DBR are not caused to have irregularities, and the coverage and adhesion properties of the passivation film are improved even at the heat radiating layer whose thickness is large. Moreover, since the stable oxide film is generated at the outermost front surfaces of the side surfaces of the lower semiconductor DBR 103 by the passivation processing, the penetration of water into the heat radiating layer can be prevented even if pin holes exist in the passivation film. Thus, resistance to high temperature and high humidity is improved, which in turn makes it possible to extend the service life of the surface-emitting laser array more than before.

Furthermore, according to the embodiment of the present invention, the heat radiating layer constitutes the lower semiconductor DBR, but the provision of the heat radiating layer is not limited to the lower semiconductor DBR. For example, even if the heat radiating layer having a high level of Al is included in the spacer layer or provided in the vicinity of the resonator structure, the step of the passivation processing described above can be applied.

Next, the configuration of the lower semiconductor DBR, to which the passivation processing according to the embodiment of the present invention is applied, is described. Here, as an example, an AlAs layer that also serves as the heat radiating layer and has an optical thickness of ¾λ is used as the low refractive-index layers of the lower semiconductor DBR.

Figure 13:
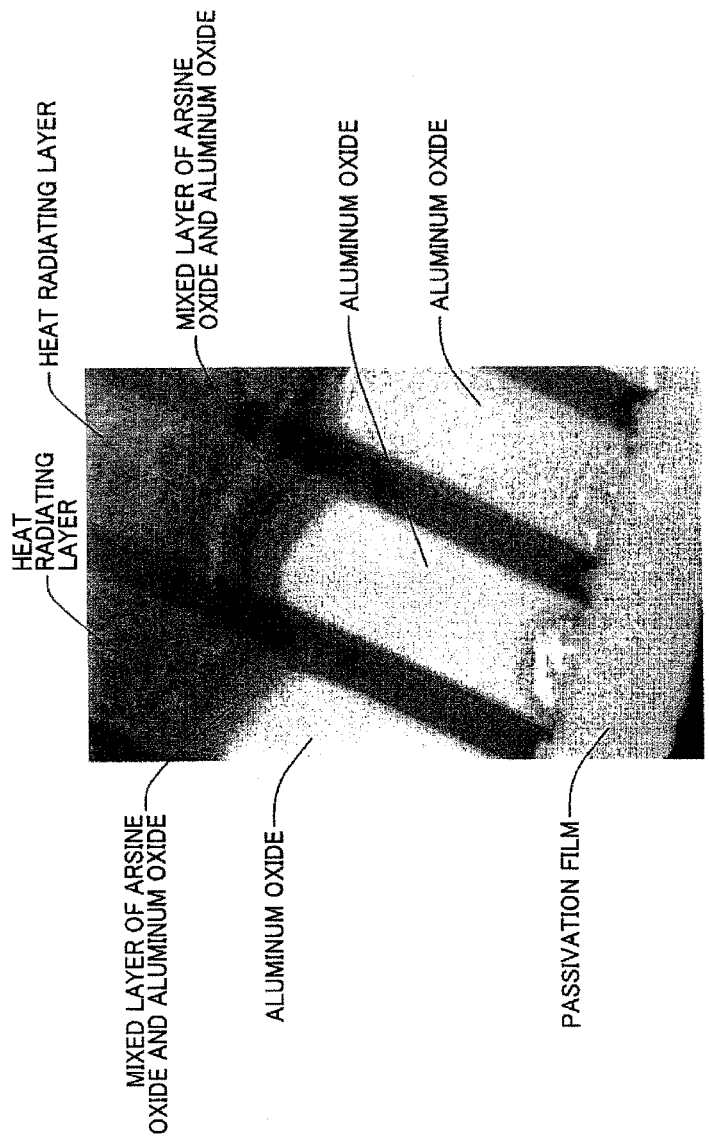
FIG. 13 shows a transmission electron microscope image (TEM image) taken near the outermost front surfaces of the side surfaces of the heat radiating layer of a lower semiconductor DBR in the surface-emitting laser array that employs passivation processing in step (11-1)

FIG. 13 shows a transmission electron microscope image (TEM image) taken near the outermost front surfaces of the side surfaces of the heat radiating layer of a lower semiconductor DBR when step (11-1) was carried out as the passivation processing. A JEM-2100F manufactured by JEOL Ltd., was used for observing the TEM image. A lower left side in FIG. 13 shows the outermost front surface of the side surface where SiN having a film thickness of 150 nm is deposited as the passivation film. An upper right side in FIG. 13 indicates the direction of the inside of the semiconductor. The inside of the semiconductor represents the heat radiating layer. A part between the heat radiating layer (AlAs) and the passivation film (SiN) is a structure manufactured by the passivation processing. It is clear from contrast that the structure is a two-layer structure.

Figure 14A:
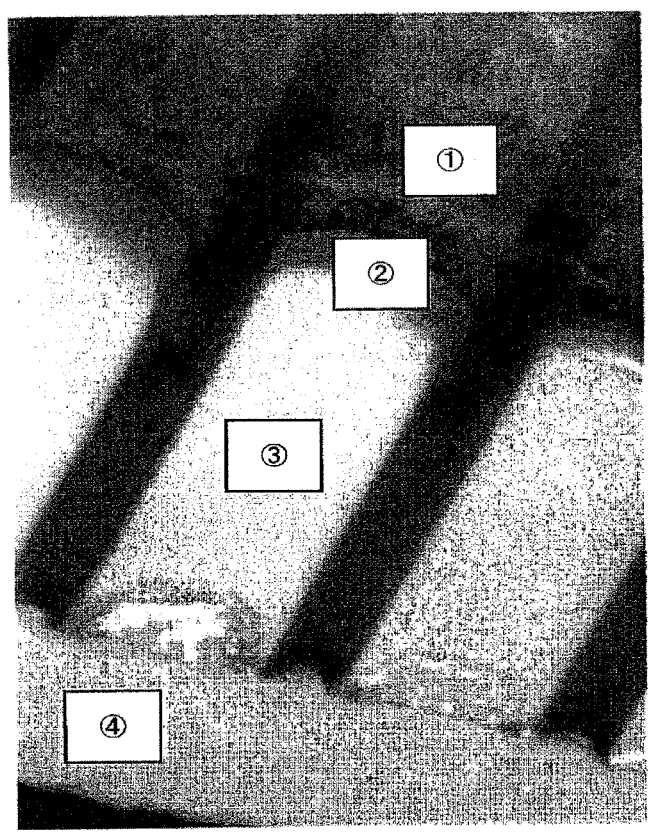

FIG. 14A shows a part where an elemental analysis was carried out by Energy-Dispersive X-ray Spectroscopy (EDS), and FIG. 14B shows results of the elemental analysis. The JEM-2100F manufactured by JEOL Ltd., was used for the EDS.

The outermost front surface of the lower semiconductor DBR next to the passivation film is a layer mainly made of the aluminum oxide. An oxidation distance of the layer mainly made of the aluminum oxide from the outermost front surface of the side surface (the thickness of the layer mainly made of the aluminum oxide) was in the range of 400 nm through 450 nm.

A layer next to the heat radiating layer at a position beneath the layer mainly made of the aluminum oxide of the lower semiconductor DBR is a mixed layer of the arsine oxide and the aluminum oxide. A distance between the layer mainly made of the aluminum oxide and the heat radiating layer (the thickness of the mixed layer of the arsine layer and the aluminum oxide) was in the range of 20 nm through 60 nm.

Many of the structures manufactured by the passivation processing are the layers mainly made of the aluminum oxide, and arsenic was hardly contained in the layers mainly made of the aluminum oxide.

The mixed layer of the arsine oxide and the aluminum oxide was formed at a position beneath the layer mainly made of the aluminum oxide in the semiconductor in such a manner as to serve as a cover.

Figure 15:
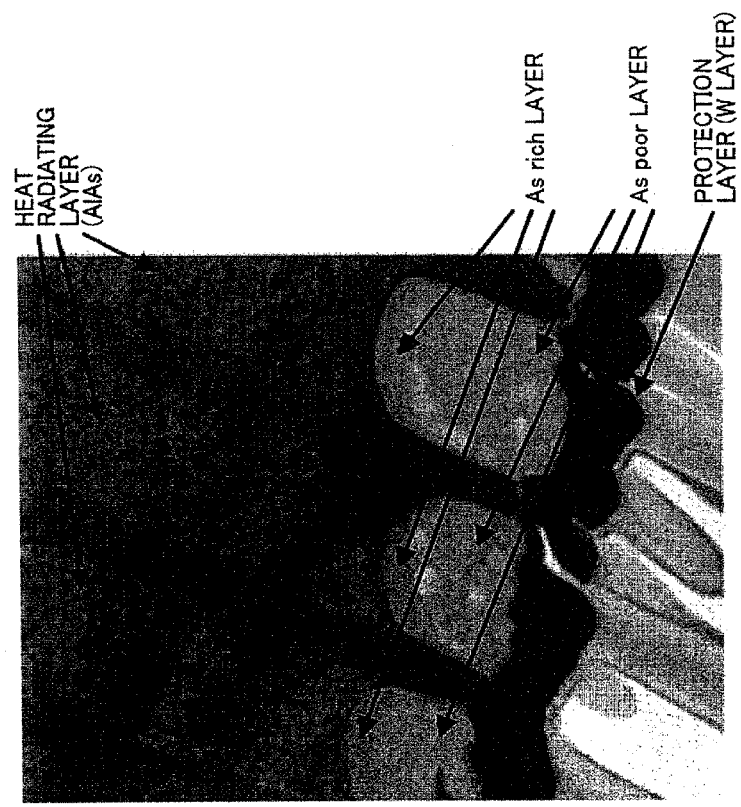
FIG. 15 shows a transmission electron microscope image (TEM image) taken near the outermost front surfaces of the side surfaces of the heat radiating layer of the lower semiconductor DBR in the surface-emitting laser array that employs the passivation processing in step (11-2)

FIG. 15 shows a transmission electron microscope image (TEM image) taken near the outermost front surfaces of the side surfaces of the heat radiating layer of the lower semiconductor DBR when step (11-2) described above was carried out as the passivation processing. However, no passivation film is deposited in a sample observed in FIG. 15.

A lower left side in FIG. 15 shows the outermost front surface of the side surface where tungsten (W) is deposited as a protection film having a thickness of 100 nm. An upper right side in FIG. 15 indicates the direction of the inside of the semiconductor. The inside of the semiconductor represents the heat radiating layer. A part between the heat radiating layer (AlAs) and the protection film (W) is a structure manufactured by the passivation processing. It is clear from contrast that the structure is a two-layer structure. The two-layer structure includes one layer on the side of the protection film, which has low contrast and is observed in a porous state, and another layer on the side of the inside of the semiconductor, which has high contrast and is arranged in a narrow range. The thickness of the structure (the oxidation distance from the outermost front surface of the side surface) manufactured by the passivation processing is in the range of 150 nm through 250 nm.

FIG. 16 shows results obtained by carrying out the elemental analysis by the EDS described above. Three parts of the heat radiating layer (AlAs layer), an As poor layer, and an As rich layer in FIG. 15 were measured.

The outermost front surface of the side surface of the lower semiconductor DBR next to the protection film is an oxide layer (As poor layer) containing aluminum (Al) and arsenic (As The layer next to the heat radiating layer at a position beneath the outermost front surface of the lower semiconductor DBR is also an oxide layer (As rich layer) containing aluminum and arsenic, but its content of arsenic is larger than that of the oxide layer (As poor layer).

In step (11-2) described above, a layer, which does not contain arsenic and is mainly made of an aluminum oxide, is not formed. A structure mainly made of the aluminum oxide is less precise and has reduced ability to sufficiently prevent the penetration of water compared to a structure containing arsenic and aluminum.

Furthermore, when the passivation processing is carried out to form an oxide, a volume change occurs accordingly. The volume change may cause deformation and vulnerability, which in turn breaks the passivation film even with a slight impact and degrades moisture resistance. Therefore, the oxide generated by the passivation processing is preferably as small as possible.

The structure formed in step (11-2) described above does not have the layer that does not contain arsenic and is mainly made of an aluminum oxide, but it has the oxide layer containing arsenic and aluminum. Therefore, even if the thickness of the layer of the passivated part is thin, the penetration of water can be prevented. Moreover, an oxide layer containing more arsenic has a greater ability to prevent the penetration of water.

Figure 17:
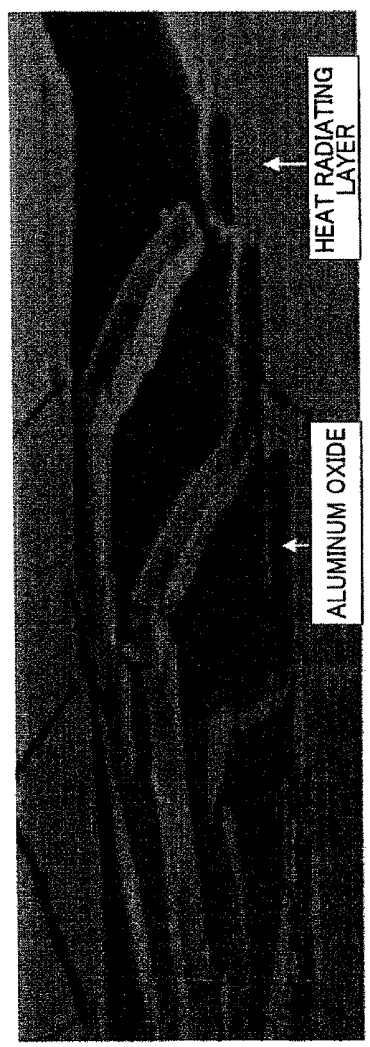
FIG. 17 shows a scanning electron microscope image (SEM image) taken at a part where the heat radiating layer is separated.

When a high-temperature and high-humidity holding test was conducted in which a surface-emitting laser device manufactured by a conventional method is left alone for 1000 hours in a container containing a high-temperature and high-humidity atmosphere having a temperature of 85° C. and a humidity of 85%, water penetrated from the side surface of the heat radiating layer to cause separation in the heat radiating layer. FIG. 17 shows a scanning electron microscope image (SEM image) taken at a part where the heat radiating layer is separated. The heat radiating layer inside the semiconductor is not oxidized, but the heat radiating layer contacting the separated part has high contrast. It is expected that the part of high contrast of the heat radiating layer is oxidized. In the oxide of the heat radiating layer formed under the atmosphere having a temperature of 85° C. and a humidity of 85%, the penetration of water cannot be prevented because oxidation progresses.

According to the embodiment of the present invention, the more stable oxide film than the oxide formed under the atmosphere having a temperature of 85° C. and a humidity of 85% is formed on the front surfaces of the side surfaces of the lower semiconductor DBR with the application of any one of step (11-1) and step (11-2) described above. Therefore, the surface-emitting laser device having high reliability can be provided.

In the optical scanner 1010 according to the embodiment of the present invention, the light source 14 has the surface-emitting laser array 100. Therefore, optical scanning can be carried out in a stabilized manner.

Furthermore, in the surface-emitting laser array 100, the interval between the neighboring light-emitting parts becomes the equal interval c when all the light-emitting parts are orthogonally projected onto an imaginary line extending in the sub-scanning corresponding direction. Therefore, with the adjustment of the timing of lighting of the light-emitting parts, it can be recognized as a configuration in which the light-emitting parts are arranged at equal interval in the sub-scanning direction on the photosensitive drum 1030.

For example, if the interval c in the surface-emitting laser array 100 is 10 μm and the magnification of an optical system is 1, 2400 dpi (dot per inch) can be realized. Of course, if the number of the light-emitting parts in the main-scanning corresponding direction is increased, or if the surface-emitting laser arrays are arranged such that the interval d is narrowed to further narrow the interval c, or if the magnification of the optical system is reduced, more high density and more high-quality printing can be made possible. Note that a writing interval in the main scanning direction can be easily controlled by the adjustment of timing of lighting of the light-emitting parts.

In this case, the laser printer 1000 can perform printing without losing its printing speed even if writing dot density is increased. Moreover, the laser printer 1000 can further increase its printing speed if the writing dot density remains the same.

Since the laser printer 1000 according to the embodiment of the present invention is provided with the optical scanner 1010, the formation f a high-quality image is made possible.

Furthermore, since the service life of the surface-emitting laser device is remarkably increased, the reuse of a writing unit or a light source unit is made possible.

Note that in the embodiment described above, the heat radiating structure has the three pairs of the low refractive-index layers 103a and the high refractive-index layers 103b. However, the number of the pairs of the low refractive-index layers 103a and the high refractive-index layers 103b is not limited to three.

Furthermore, in the embodiment described above, each of the heat radiating layers has an optical thickness of $3\lambda/4$. However, the optical thickness of each of the heat radiating layers is not limited to $3\lambda/4$. In other words, each of the heat radiating layers is only required to have an optical thickness of $\lambda/4$ or larger.

Furthermore, in the embodiment described above, the heat radiating layer is arranged in the lower semiconductor DBR. However, the position where the heat radiating layer is arranged is not limited to the lower semiconductor DBR. For example, the heat radiating layer may be arranged in the resonator structure or arranged next to the resonator structure.

Furthermore, in the embodiment described above, the heat radiating layer is made of $Al_{0.9}Ga_{0.1}As$. However, the material of the heat radiating layer is not limited to $Al_{0.9}Ga_{0.1}As$. The heat radiating layer is only required to be made of a material having high heat conductivity. For example, an Al(Ga)As system having an Al composition of 0.9 or more is preferable, and AlAs having the highest heat conductivity is the most preferable.

Furthermore, in the embodiment described above, the heat radiating layer containing Al is passivated as the passivation processing. However, an object to be passivated is not limited to the one applied to the heat radiating layer containing Al. That is, even other layers containing Al can prevent corrosion when they are passivated. For example, since a semiconductor DBR using AlGaAs having an optical thickness of $\lambda/4$ may be corroded when its side surfaces are exposed to the atmosphere, it has the advantage of preventing corrosion with the passivation similarly to the embodiment described above.

Meanwhile, the plural surface-emitting laser devices are generally formed on a semiconductor wafer at the same time and then divided into individual chips. When etching at the time of forming the mesas is not applied up to the substrate, the side surfaces of the laminated body, on which the semiconductor layer constituting the surface-emitting laser devices is laminated, necessarily emerge at the end parts of the chip. The emerging side surfaces are protected by the passivation processing.

Furthermore, in step (11-1) described above according to the embodiment of the present invention, after being placed in the chamber for heat treatment, the laminated body may be instantaneously added with low-temperature (200° C. or lower) vapor to have a natural oxide film on its front surface and be held at temperature of 380° C. through 900° C. in a nitrogen atmosphere.

Furthermore, in the embodiment described above, the active layer 105 may be an active layer composed of three quantum well layers made of GaInPAs as a composition inducing a compression distortion and having a bandgap wavelength of about 780 nm and composed of four barrier layers matched to the quantum well layers and made of $Ga_{0.6}In_{0.4}P$ as a composition inducing a tensile distortion. Here, a wide bandgap, $(Al_{0.7}Ga_{0.3})_{0.5}In_{0.5}P$, may be used as each of the spacer layers. In this case, a difference in the bandgap between the spacer layers and the quantum well layers can be made extremely large compared with a case in which the spacer layers are made of an AlGaAs system. Moreover, by containing In, the spacer layers can improve the control of the etched bottom surface at the time of forming the mesas. In this case, trimethyl indiu (TMI) can be used as a group III material, and phosphine ($PH_3$) can be used as a group V material.

Furthermore, in the embodiment described above, the mesas at the cross section orthogonal to a laser oscillation direction are square-shaped, but the shape of the mesas is not limited to a square. For example, the shape of the mesas can be in any shape such as a circle, an ellipse, or a rectangle.

Furthermore, in the embodiment described above, the light-emitting parts have an oscillation wavelength of 780 nm. However, the oscillation wavelength of the light-emitting parts is not limited to 780 nm. The oscillation wavelength may be changed in accordance with the characteristics of the photosensitive body.

Furthermore, the surface-emitting laser array 100 can be applied not only to the image forming apparatus but also to other purposes. In this case, the light-emitting parts may have an oscillation wavelength of 650 nm, 850 nm, 980 nm, 1.3 μm, 1.5 μm, or the like in accordance with intended purposes.

Furthermore, in the embodiment described above, the surface-emitting laser array 100 has the 21 light-emitting parts. However, the number of the light-emitting parts is not limited to 21.

Furthermore, in the embodiment described above, instead of the surface-emitting laser array 100, the light source 14 may be manufactured by the same manufacturing method as the surface-emitting laser array 100 so that the light-emitting parts have one surface-emitting laser device.

Figure 18A:
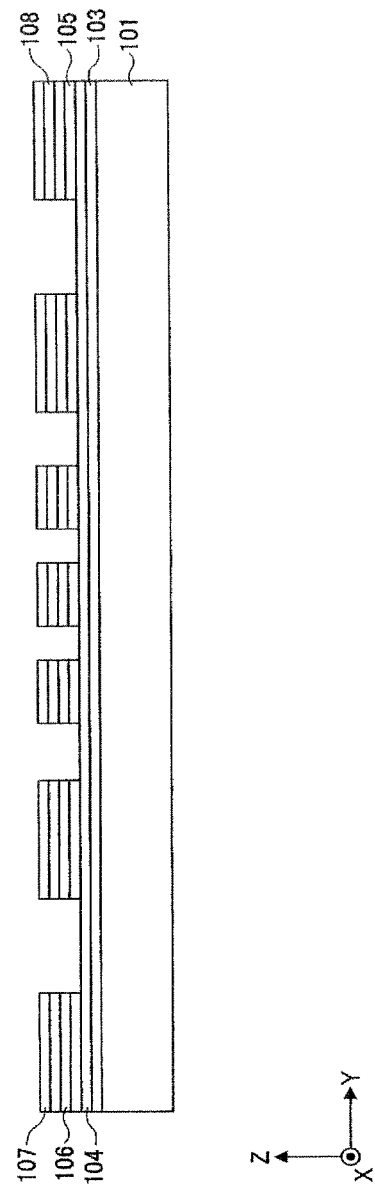
Figure 18D:
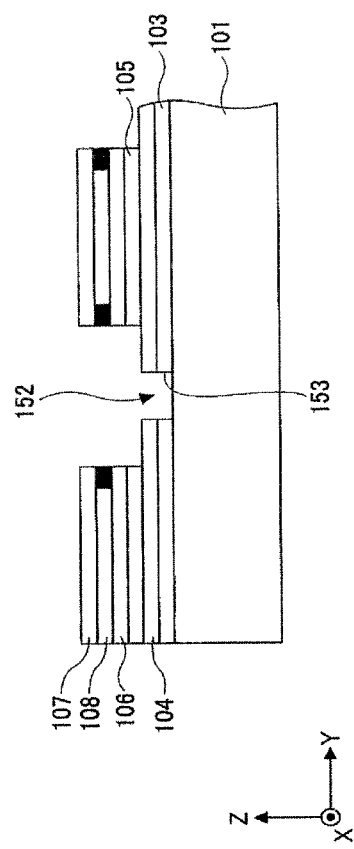
Figure 19C:
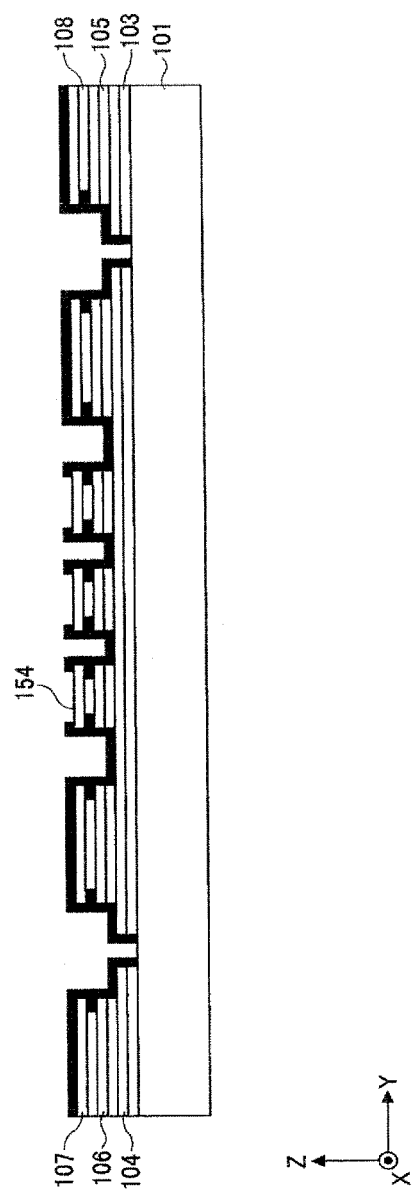
Figure 20C:
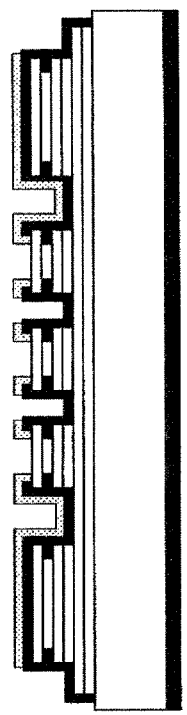

Furthermore, in the embodiment described above, as shown in FIG. 18A as an example, regions serving as grooves for separation may be etched at the same time when the mesas are formed. FIG. 18B is a diagram corresponding to FIG. 7C; FIG. 18C is a diagram corresponding to FIG. 10A; and FIG. 18D is a diagram corresponding to FIG. 10B. FIG. 19A is a diagram corresponding to FIG. 10C; FIG. 19B is a diagram corresponding to FIG. 10D; and FIG. 19C is a diagram corresponding to FIG. 11A. FIG. 20A is a diagram corresponding to FIG. 11B; FIG. 20B is a diagram corresponding to FIG. 11C; and FIG. 200 is a diagram corresponding to FIG. 11D.

Furthermore, in the embodiment described above, the laser printer 1000 is used as the image forming apparatus. However, the image forming apparatus is not limited to the laser printer 1000.

For example, an image forming apparatus, which directly applies laser light to a medium (such as a sheet) that develops a color with laser light, may be used.

Furthermore, an image forming apparatus, which uses a silver halide film as an image carrier, may be used. In this case, a latent image is formed on the silver halide film by optical scanning. The formed latent image can be visualized by processing equivalent to development processing in a general silver halide photography process. Then, the latent image can be transferred to a printing sheet by processing equivalent to baking processing in the general silver halide photography process. Such an image forming apparatus can be implemented as a light plate-making apparatus and a light drawing apparatus that draws a CT-scanning image or the like.

Figure 21:
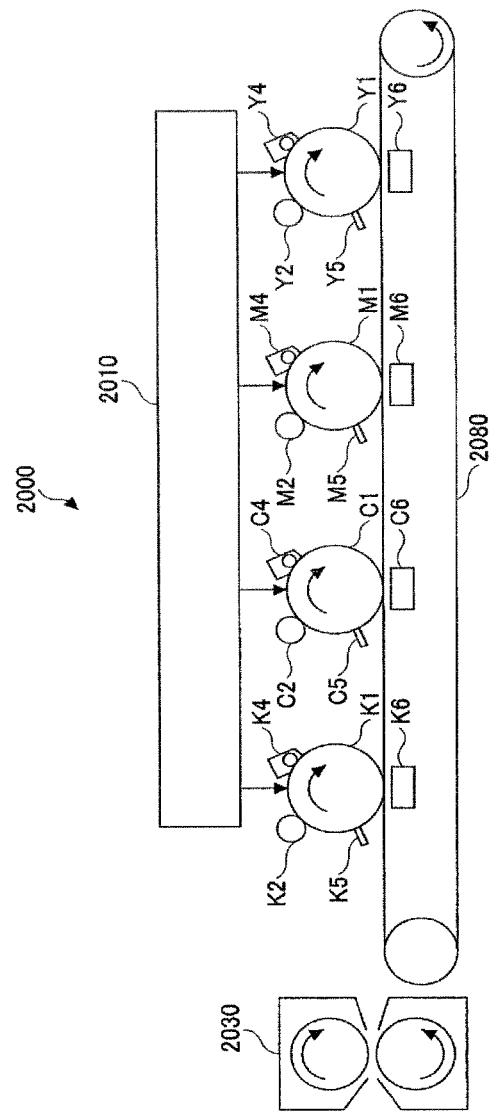
FIG. 21 is a diagram for explaining the schematic configuration of a color printer.

Furthermore, as shown in FIG. 21 as an example, a color printer 2000 having plural photosensitive drums may be used.

The color printer 2000 is a tandem-type multicolor printer that forms a full-color image by superimposing four colors (black, cyan, magenta, and yellow) one on another. The color printer 2000 has components for black consisting of a photosensitive drum K1, a charging unit K2, a developing unit K4, a cleaning unit K5, and a transfer unit K6; components for cyan consisting of "a photosensitive drum C1, a charging unit C2, a developing unit C4, a cleaning unit C5, and a transfer unit C6; components for magenta consisting of a photosensitive drum M1, a charging unit M2, a developing unit M4, a cleaning unit M5, and a transfer unit M6; components for yellow consisting of a photosensitive drum Y1, a charging unit Y2, a developing unit Y4, a cleaning unit Y5, and a transfer unit Y6; an optical scanner 2010; a transfer belt 2080; a fixing unit 2030; and the like.

Each of the photosensitive drums rotates in the direction as indicated by an arrow in FIG. 21. At the periphery of each of the photosensitive drums, the charging unit, the developing unit, the transfer unit, and the cleaning unit are arranged in a rotating order. Each of the charging units uniformly charges the front surface of the corresponding photosensitive drum. The optical scanner 2010 applies light to the charged front surface of each of the photosensitive drums to form a latent image on each of the photosensitive drums. Then, a toner image is formed on the front surface of each of the photosensitive drums by the corresponding developing unit. Moreover, the toner image in each of the colors is transferred to a recording sheet on the transfer belt 2080 by the corresponding transfer unit. Finally, an image is fixed to the recording sheet by the fixing unit 2030.

The optical scanner 2010 has a light source including a surface-emitting laser array similar to the surface-emitting laser array 100 for each color. Therefore, the optical scanner 2010 can obtain the same effects as those of the optical scanner 1010. Furthermore, with the provision of the optical scanner 2010, the color printer 2000 can obtain the same effects as those of the laser printer 1000.

Meanwhile, in the color printer 2000, a color shift may occur due to the manufacturing error, the positional error, or the like of the components. Even in this case, since each of the light sources of the optical scanner 2010 has the surface-emitting laser array, the color printer 2000 can reduce the color shift by selecting the light-emitting part to be lighted.

As described above, the manufacturing method according to the embodiment of the present invention is suitable for manufacturing the surface-emitting laser device having high reliability. Furthermore, the surface-emitting laser device and the surface-emitting laser array according to the embodiment of the present invention are suitable for improving reliability more than before. Furthermore, the optical scanner according to the embodiment of the present invention is suitable for carrying out optical scanning in a stabilized manner. Furthermore, the image forming apparatus according to the embodiment of the present invention is suitable for forming a high-quality image.

The present application is based on Japanese Priority Applications No. 2008-296195 filed on Nov. 20, 2008, No. 2009-098657 filed on Apr. 15, 2009, and No. 2009-230090 filed on Oct. 2, 2009, with the Japan Patent Office, the entire contents of which are hereby incorporated by reference.

The invention claimed is:

1. A manufacturing method for manufacturing a surface-emitting laser device that emits laser light in a direction perpendicular to a substrate, the manufacturing method comprising:
    a step of forming a laminated body in which a lower reflecting mirror, a resonator structure including an active layer, and an upper reflecting layer having a selective oxidized layer are laminated on the substrate;
    a step of etching the laminated body to form a mesa structure having the selective oxidized layer exposed at side surfaces thereof;
    a step of selectively oxidizing the selective oxidized layer from the side surfaces of the mesa structure to form a constriction structure in which a current passing region is surrounded by an oxide;
    a step of forming a separating groove at a position away from the mesa structure;
    a step of passivating an outermost front surface of at least a part of the laminated body exposed when the separating groove is formed; and
    a step of coating a passivated part with a dielectric body.

2. The manufacturing method according to claim 1, wherein,
in the step of passivating the outermost front surface of at least the part of the laminated body, the outermost front surface is oxidized.

3. The manufacturing method according to claim 1, wherein
the step of passivating the outermost front surface of at least the part of the laminated body includes a heat treatment in an atmosphere concurrently containing at least both water and oxygen ($O_2$).

4. The manufacturing method according to claim 3, wherein
the step of passivating the outermost front surface of at least the part of the laminated body includes an ammonia-water immersing treatment conducted prior to the heat treatment.

5. The manufacturing method according to claim 1, wherein
the lower reflecting mirror includes a heat radiating layer.

6. The manufacturing method according to claim 5, wherein
the lower reflecting mirror has plural pairs of low refractive-index layers and high refractive-index layers, and
the heat radiating layer is the low refractive-index layer of at least one of the plural pairs and has an optical thickness of "an oscillation wavelength/4" or larger.

7. The manufacturing method according to claim 1, wherein
in the step of coating the passivated part with the dielectric body, anyone of SiN, $SiO_2$, and SiON is coated by a plasma CVD.

8. The manufacturing method according to claim 1, further comprising:
a step of removing an unnecessary oxide from the side surfaces of the mesa structure forming the constriction structure.

* * * * *